US011342453B2

(12) United States Patent
Shen et al.

(10) Patent No.: US 11,342,453 B2
(45) Date of Patent: May 24, 2022

(54) FIELD EFFECT TRANSISTOR WITH ASYMMETRIC GATE STRUCTURE AND METHOD

(71) Applicant: GlobalFoundries U.S. Inc., Malta, NY (US)

(72) Inventors: Yanping Shen, Saratoga Springs, NY (US); Haiting Wang, Clifton Park, NY (US); Zhiqing Li, Halfmoon, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/996,010

(22) Filed: Aug. 18, 2020

(65) Prior Publication Data

US 2022/0059691 A1 Feb. 24, 2022

(51) Int. Cl.
*H01L 29/78* (2006.01)
*H01L 29/66* (2006.01)
*H01L 29/08* (2006.01)
*H01L 21/28* (2006.01)
*H01L 29/49* (2006.01)
(Continued)

(52) U.S. Cl.
CPC .... *H01L 29/7816* (2013.01); *H01L 21/28105* (2013.01); *H01L 21/28114* (2013.01); *H01L 29/0653* (2013.01); *H01L 29/0878* (2013.01); *H01L 29/42376* (2013.01); *H01L 29/4983* (2013.01); *H01L 29/513* (2013.01);
(Continued)

(58) Field of Classification Search
CPC ......... H01L 21/28105; H01L 21/28114; H01L 29/0653; H01L 29/42376; H01L 29/4983; H01L 29/513; H01L 29/517
See application file for complete search history.

(56) References Cited

U.S. PATENT DOCUMENTS

| | | | |
|---|---|---|---|
| 6,876,035 B2 | 4/2005 | Abadeer et al. | |
| 7,829,945 B2 | 11/2010 | Adkisson et al. | |
| 8,237,233 B2 | 8/2012 | Anderson et al. | |
| 8,748,271 B2 | 6/2014 | Toh et al. | |

(Continued)

OTHER PUBLICATIONS

Dinh et al., Novel 5V-EDMOS Transistor with a Record fmax of 450 GHz in a Baseline 40nm CMOS Technology, IEEE, 2017, pp. 25.5.1-25.5.4.

(Continued)

*Primary Examiner* — Marcos D. Pizarro
(74) *Attorney, Agent, or Firm* — Gibb & Riley, LLC; Francois Pagette

(57) ABSTRACT

Disclosed is a lateral double-diffused metal oxide semiconductor field effect transistor (LDMOSFET) with a replacement metal gate (RMG) structure that includes a first section, which traverses a semiconductor body at a channel region in a first-type well, and a second section, which is adjacent to the first section and which traverses the semiconductor body at a drain drift region in a second-type well. The RMG structure includes, in both sections, a first-type work function layer and a second-type work function layer on the first-type work function layer. However, the thickness of the first-type work function layer in the first section is greater than the thickness in the second section such that the RMG structure is asymmetric. Thus, threshold voltage (Vt) at the first section is greater than Vt at the second section and the LDMOSFET has a relatively high breakdown voltage (BV). Also disclosed are methods for forming the LDMOSFET.

14 Claims, 27 Drawing Sheets

(51) Int. Cl.
  *H01L 29/51*   (2006.01)
  *H01L 29/06*   (2006.01)
  *H01L 29/423*  (2006.01)

(52) U.S. Cl.
  CPC ...... *H01L 29/517* (2013.01); *H01L 29/66545* (2013.01); *H01L 29/66681* (2013.01)

(56) References Cited

U.S. PATENT DOCUMENTS

| | | |
|---|---|---|
| 8,896,035 B2 | 11/2014 | Murali et al. |
| 9,034,711 B2 | 5/2015 | Toh et al. |
| 9,337,310 B2 | 5/2016 | Letavic et al. |
| 9,406,679 B2 | 8/2016 | Edge et al. |
| 9,853,021 B1 | 12/2017 | Wang et al. |
| 10,050,115 B2 | 8/2018 | Brown et al. |
| 10,276,679 B2 | 4/2019 | Chiu et al. |
| 2004/0036129 A1 | 2/2004 | Forbes et al. |
| 2012/0175703 A1* | 7/2012 | Park ............ H01L 29/7835 257/E29.256 |
| 2014/0054717 A1 | 2/2014 | Edge et al. |
| 2015/0048447 A1 | 2/2015 | Sharma et al. |
| 2015/0318378 A1 | 11/2015 | Letavic et al. |
| 2016/0190269 A1 | 6/2016 | Brown et al. |
| 2018/0286761 A1* | 10/2018 | Guo ............ H01L 27/1211 |
| 2019/0131417 A1* | 5/2019 | Hong ............ H01L 29/4966 |

OTHER PUBLICATIONS

Lee et al., "Implementation of High Power RF Devices with Hybrid Workfunction and OxideThickness in 22nm Low-Power FinFET Technology", IEEE, 2019, pp. 25.4.1-25.4.4.

Miyata et al., "150 GHz FMAX with High Drain Breakdown Voltage Immunity by Multi Gate Oxide Dual Work-Function (MGO-DWF)-MOSFET", IEEE, 2015, pp. 25.8.1-25.8.4.

Das et al. "Performance Analysis of Devices in Double Gate MOSFET", International Journal of Engineering and Advanced Technology (IJEAT), vol. 7, Issue 1, 2017, pp. 131-136.

Kumar et al., "Improving the Breakdown Voltage, ON-Resistance and Gate-Charge of InGaAs LDMOS Power Transistors", Semiconductor Science and Technology, vol. 27, No. 10, 2012, pp. 1-13.

* cited by examiner

Process Flow B

FIELD EFFECT TRANSISTOR WITH ASYMMETRIC GATE STRUCTURE AND METHOD

BACKGROUND

Field of the Invention

The present invention relates to field effect transistors (FETs) and, particularly, to lateral double-diffused metal oxide semiconductor field effect transistors (LDMOSFETs) and to methods of forming the LDMOSFETs.

Description of Related Art

Radio frequency (RF) applications typically require field effect transistors (FETs) with a high breakdown voltage (BV). Lateral double-diffused metal oxide semiconductor field effect transistors (LDMOSFETs) have been developed to provide this high BV; however, an even higher BV may be beneficial for some applications. Current techniques for further increasing the BV of an LDMOSFET include implant engineering. Unfortunately, implant engineering may be insufficient to achieve the high BV required for emerging technologies (e.g., sub-6 GHz WiFi power amplifier (PA) applications).

SUMMARY

Disclosed herein are embodiments of a transistor. The transistor can include a semiconductor body. The transistor can further include, within the semiconductor body, a first-type well and a second-type well positioned laterally adjacent to the first-type well. The first-type well can have a first-type conductivity and the second-type well can have a second-type conductivity that is different from the first-type conductivity. The transistor can further include a gate structure on the semiconductor body at the junction between the first-type well and the second-type well. The gate structure can have a first section, which traverses the semiconductor body adjacent to the first-type well, and a second section, which is positioned laterally adjacent to the first section and which traverses the semiconductor body adjacent to the second-type well. The gate structure can include, within both the first section and the second section, a first-type work function layer and second-type work function layer on the first-type work function layer. The first-type work function layer can have a first-type work function, which is within a first range of work functions, and the second-type work function layer can have a second-type work function, which is within a second range of work functions that is different from the first range. Additionally, a first portion of the first-type work function layer within the first section can have a first thickness and a second portion of the first-type work function layer within the second section can have a second thickness that is less than the first thickness such that the gate structure is asymmetric.

In some embodiments, the transistor can be an N-type field effect transistor (NFET). The NFET can include a semiconductor body and, within the semiconductor body, a Pwell and an Nwell positioned laterally adjacent to the Pwell. The NFET can further include a gate structure on the semiconductor body at the junction between the Pwell and the Nwell. The gate structure can have a first section, which traverses the semiconductor body adjacent to the Pwell, and a second section, which is positioned laterally adjacent to the first section and which traverses the semiconductor body adjacent to the Nwell. The gate structure can include, within both the first section and the second section, a P-type work function layer and an N-type work function layer on the P-type work function layer. Additionally, a first portion of the P-type work function layer within the first section can have a first thickness and a second portion of the P-type work function layer within the second section can have second thickness that is less than the first thickness such that the gate structure is asymmetric.

Also disclosed herein are embodiments of a method for forming a transistor. The method can include forming, within a semiconductor body, a first-type well, which has a first-type conductivity, and a second-type well, which is positioned laterally adjacent to the first-type well and which has a second-type conductivity that is different from the first-type conductivity. The method can also include forming a gate structure on the semiconductor body at the junction between the first-type well and the second-type well. This gate structure can be formed such it has a first section, which traverses the semiconductor body adjacent to the first-type well, and such that it has a second section, which is positioned laterally adjacent to the first section, which is different from the first section, and which traverses the semiconductor body adjacent to the second-type well. Specifically, the process of forming the gate structure can include forming a first-type work function layer, which has a first-type work function within a first range of work functions, in both the first section and the second section and further doing so such that a first portion of the first-type work function layer within the first section has a first thickness and a second portion of the first-type work function layer within the second section has a second thickness that is less than the first thickness. The process of forming the gate structure can further include forming a second-type work function layer, which has a second-type work function within a second range of work functions that is different from the first range, on the first-type work function layer in both the first section and in the second section.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, radio frequency (RF) applications typically require field effect transistors (FETs) with a high breakdown voltage (BV) (also referred to in the art as blocking voltage or drain-source voltage ($V_{DS}$)). Lateral double-diffused metal oxide semiconductor field effect transistors (LDMOSFETs) have been developed to provide this high BV. An LDMOSFET, like a conventional FET, includes a channel region positioned laterally between a source region and a drain region. But, in the LDMOSFET, the channel region is positioned closer to the source region than it is to the drain region and the space between the channel region and the drain region includes a relatively low-doped drain drift region. A gate structure (e.g., a replacement metal gate (RMG) structure) is positioned adjacent to both the channel region and the drain drift region. During LDMOSFET operation, the drain drift region provides ballasting resistance and, thereby a relatively high BV as compared to the BV of a conventional FET. However, some applications may benefit from an even higher BV. Current techniques for further increasing the BV of an LDMOSFET include implant engineering. Unfortunately, implant engineering may be insufficient to achieve the high BV required for emerging technologies (e.g., sub-6 GHz WiFi power amplifier (PA) applications).

In view of the foregoing, disclosed herein are embodiments of a lateral double-diffused metal oxide semiconductor field effect transistor (LDMOSFET) with a replacement metal gate (RMG) structure that is asymmetrically configured to increase the breakdown voltage (BV). Specifically, the RMG structure can have a first section, which traverses a semiconductor body at a channel region in a first-type well, and a second section, which is positioned laterally adjacent to the first section and which traverses the semiconductor body at a drain drift region in a second-type well. The RMG structure can include, in both sections, a first-type work function layer and a second-type work function layer on the first-type work function layer. However, a first thickness of a first portion of the first-type work function layer in the first section is greater than a second thickness of a second portion of the first-type work function layer in the second section such that the RMG structure is asymmetric. As a result, the threshold voltage (Vt) at the first section of the RMG structure is greater than the Vt at the second section of the RMG structure and the LDMOSFET has a greater BV (e.g., as compared to an LDMOSFET with a symmetric RMG structure). Also disclosed herein are method embodiments for forming such an LDMOSFET.

Figure 1A:
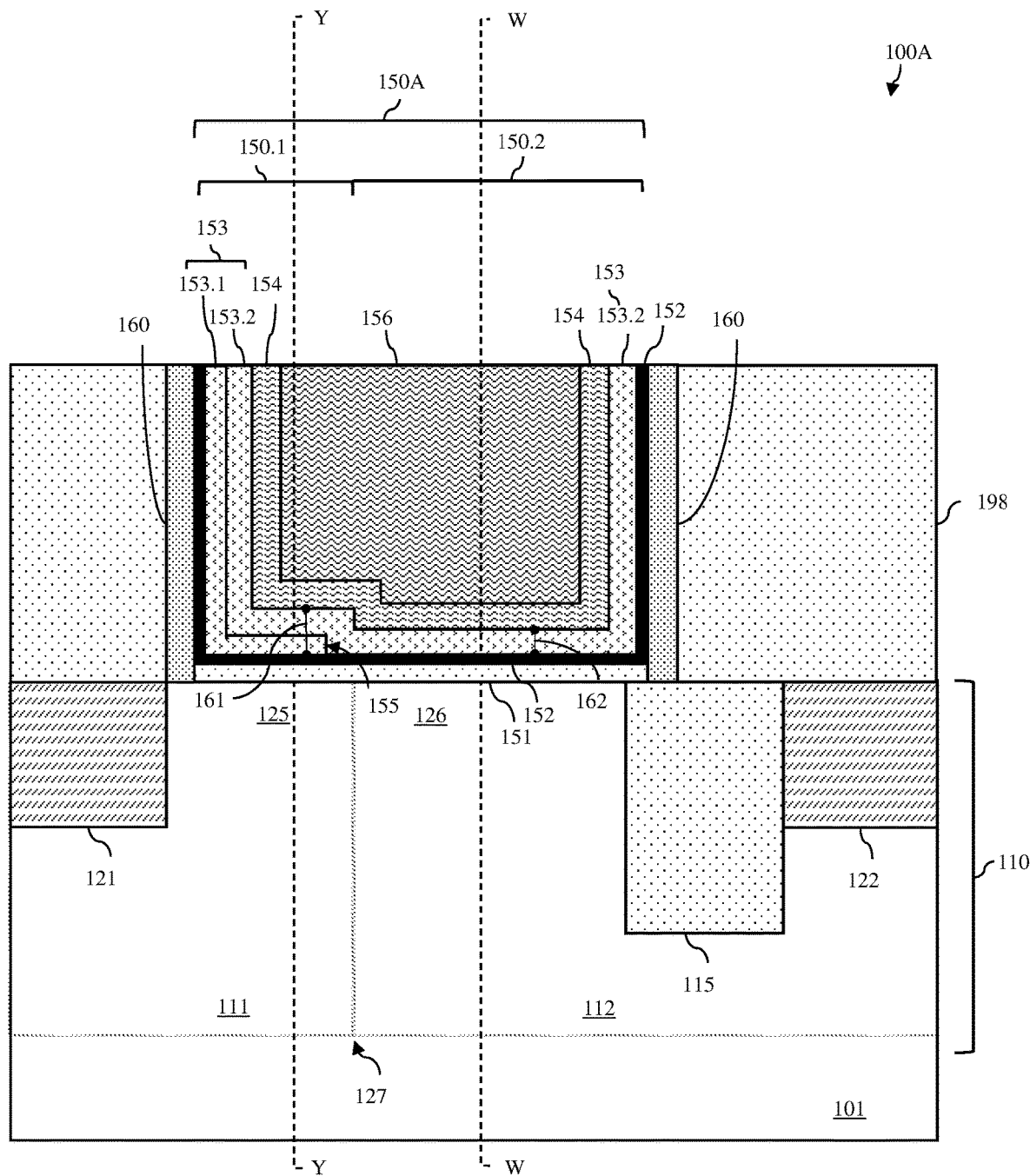
FIG. 1A is a cross-section diagram illustrating an embodiment of a lateral double-diffused metal oxide semiconductor field effect transistor (LDMOSFET) with an asymmetric replacement metal gate (RMG) structure.
Figure 1B:
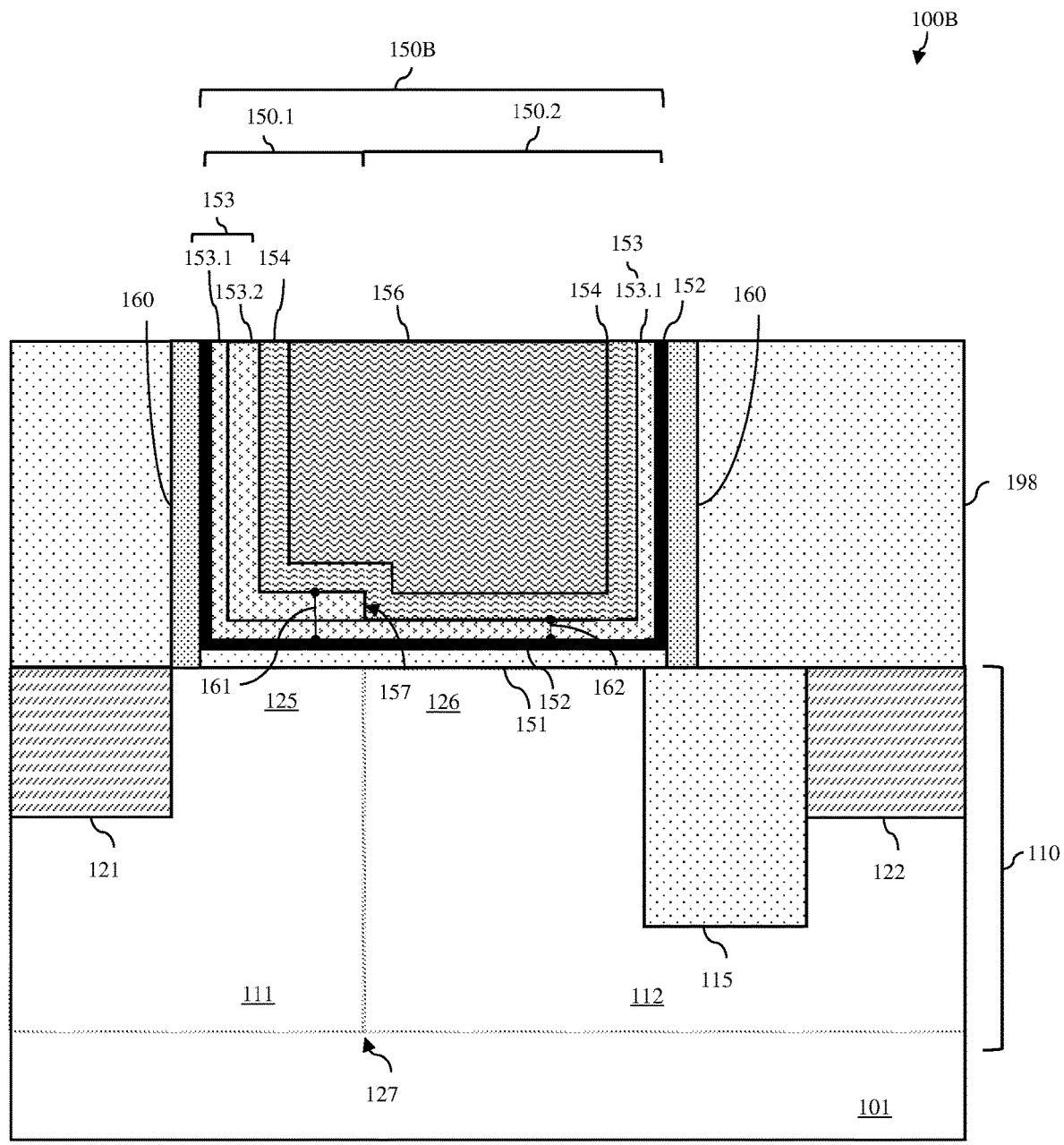
FIG. 1B is a cross-section diagram illustrating another embodiment of a LDMOSFET with an asymmetric RMG structure.
Figure 1C:
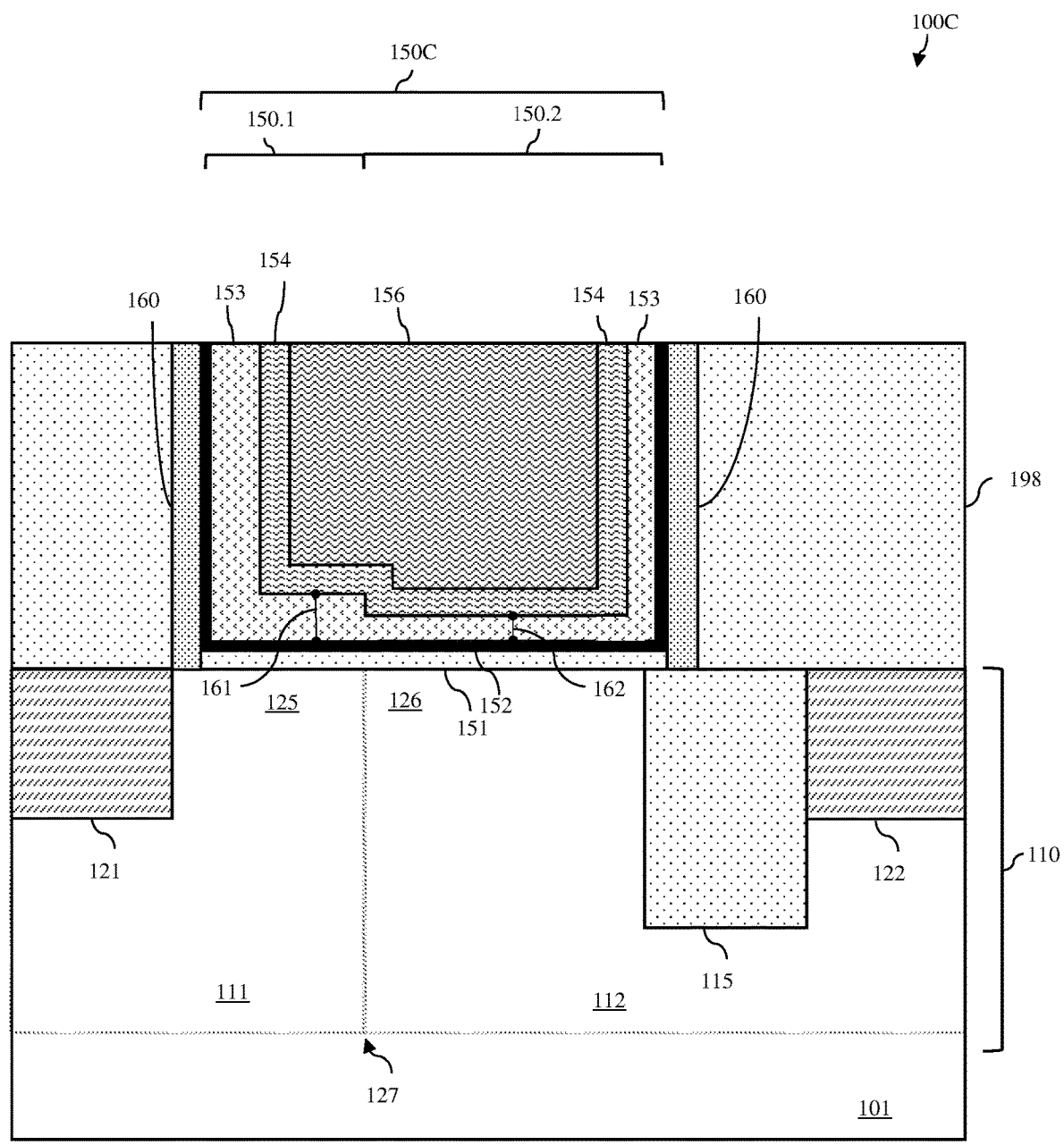
FIG. 1C is a cross-section diagram illustrating yet another embodiment of a LDMOSFET with an asymmetric RMG structure.

More particularly, FIGS. 1A-1C are lengthwise cross-section diagrams of embodiments of a lateral double-diffused metal oxide semiconductor field effect transistor (LDMOSFET) 100A-100C, respectively. For purposes of illustration, each of the disclosed LDMOSFET embodiments is described below and illustrated in the drawings as being a non-planar FET and, particularly, a fin-type FET (FINFET)). However, it should be understood that the salient aspects of the present invention are directed to the asymmetric characteristics of a replacement metal gate (RMG) structure and the Figures showing FINFETs are not intended to be limiting. Alternatively, the LDMOSFET embodiments could be, for example, a planar FET, a gate-all-around FET (GAAFET), etc.

The LDMOSFET 100A-100C can be on a semiconductor substrate 101. The semiconductor substrate 101 can be a bulk semiconductor substrate (e.g., a bulk silicon substrate), as illustrated. Alternatively, the semiconductor substrate could be a semiconductor-on-insulator structure (e.g., a silicon-on-insulator (SOI) structure) with the LDMOSFET being formed from the semiconductor layer on the insulator (e.g., in a silicon layer on a buried oxide layer). Optionally, the semiconductor substrate 101 can have a first-type conductivity at a relatively low conductivity level (e.g., the semiconductor substrate 101 can be a P– silicon substrate).

The LDMOSFET 100A-100C can include at least one semiconductor body 110 on the semiconductor substrate 101. For a FINFET on a bulk semiconductor substrate, the semiconductor body 110 can be a semiconductor fin (i.e., a relatively thin rectangular or fin-shaped semiconductor body), which has been patterned and etched into an upper portion of the semiconductor substrate such that it extends vertically away from a lower portion of the semiconductor substrate. A FINFET on a bulk semiconductor substrate can further include a buried isolation layer (e.g., a buried oxide layer) on the lower portion of the semiconductor substrate laterally surrounding a lower portion of the semiconductor fin. Those skilled in the art will recognize that shape and/or position of the semiconductor body relative to the semiconductor substrate as well as any isolation regions around the semiconductor body will vary in the case of planar and gate-all-around FETs.

The LDMOSFET 100A-100C can further include, in the semiconductor body 110, a first-type well 111, which has the first-type conductivity at a higher conductivity level than the semiconductor substrate 101, and a second-type well 112, which is positioned laterally immediately adjacent to the first-type well 111 and which has a second-type conductivity that is different from the first-type conductivity. A "well" refers to a doped region within the semiconductor material of the semiconductor body. The doped region is doped with a dopant that is preselected to achieve a desired type of conductivity (e.g., P-type or N-type conductivity) at a desired level of conductivity. See the detailed discussion below regarding exemplary dopants that can be used to achieve N-type and P-type conductivity within the semiconductor body. It should be noted that the terms "first-type" and "second-type" are referred to throughout this specification; however, the meaning of the terms "first-type" and "second-type" will be vary depending upon whether the LDMOSFET is an N-type FET (NFET) or a P-type FET (NFET). For an NFET, "first-type" means P-type and "second-type" means N-type. For a PFET, "first-type" means N-type and "second-type" means P-type. Thus, for example, for an NFET, the first-type well is a P-type well (Pwell) and the second-type well is an N-type well (Nwell).

In the LDMOSFET 100A-100C portions of the first-type well 111 and the second-type well 112 immediately adjacent to the junction 127 between the two wells 111 and 112 form the channel region 125 and the drain drift region 126, respectively.

The LDMOSFET 100A-100C can further include a source region 121 and a drain region 122. The source region 121 can be in contact with the first-type well 111 and positioned laterally adjacent to the channel region 125. The drain region 122 can be in contact with the second-type well 112 and positioned laterally adjacent to the drain drift region 126. Thus, across the length of the LDMOSFET 100A-100C, the channel region 125 is positioned laterally adjacent to the source region 121, the drain drift region 126 is positioned laterally adjacent to the channel region 125 such that the channel region 125 is between the source region 121 and the drain drift region 126, and the drain region 122 is positioned laterally adjacent to the drain drift region 126 such that the drain drift region 126 is between the channel region 125 and the drain region 122. The source and drain regions 121-122 can have the second-type conductivity at a higher conductivity level than the second-type well. Thus, for an NFET, the source and drain regions 121-122 can be N+ source/drain regions.

Optionally, the LDMOSFET 100A-100C can further include a trench isolation region 115 in the second-type well 112 positioned laterally between the drain drift region 126 and the drain region 122. The trench isolation region 115 can include a trench, which extends vertically into the semiconductor body 110 between the drain and drain drift regions and which is filled with one or more layers of isolation material (e.g., silicon dioxide or other suitable isolation material). The bottom of the trench isolation region 115 should be at some depth above the level of the bottom of the second-type well 112 to allow for a current path through the second-type well 112 to the drain region 122.

The LDMOSFET 100A-100C can further include a replacement metal gate (RMG) structure 150A-150C, which is asymmetrically configured, on the semiconductor body at the junction 127 between the first-type well 111 and the second-type well 112. The RMG structure 150A-150C can have a first section 150.1, which traverses the semiconductor body 110 (i.e., extends across the full width of the semiconductor body 110) adjacent to the channel region 125 in the first-type well 111, and a second section 150.2, which is positioned laterally adjacent to the first section 150.2 and which traverses the semiconductor body 110 (i.e., extends across the full width of the semiconductor body 110) adjacent to the drain drift region 126 in the second-type well 112.

Figure 2:
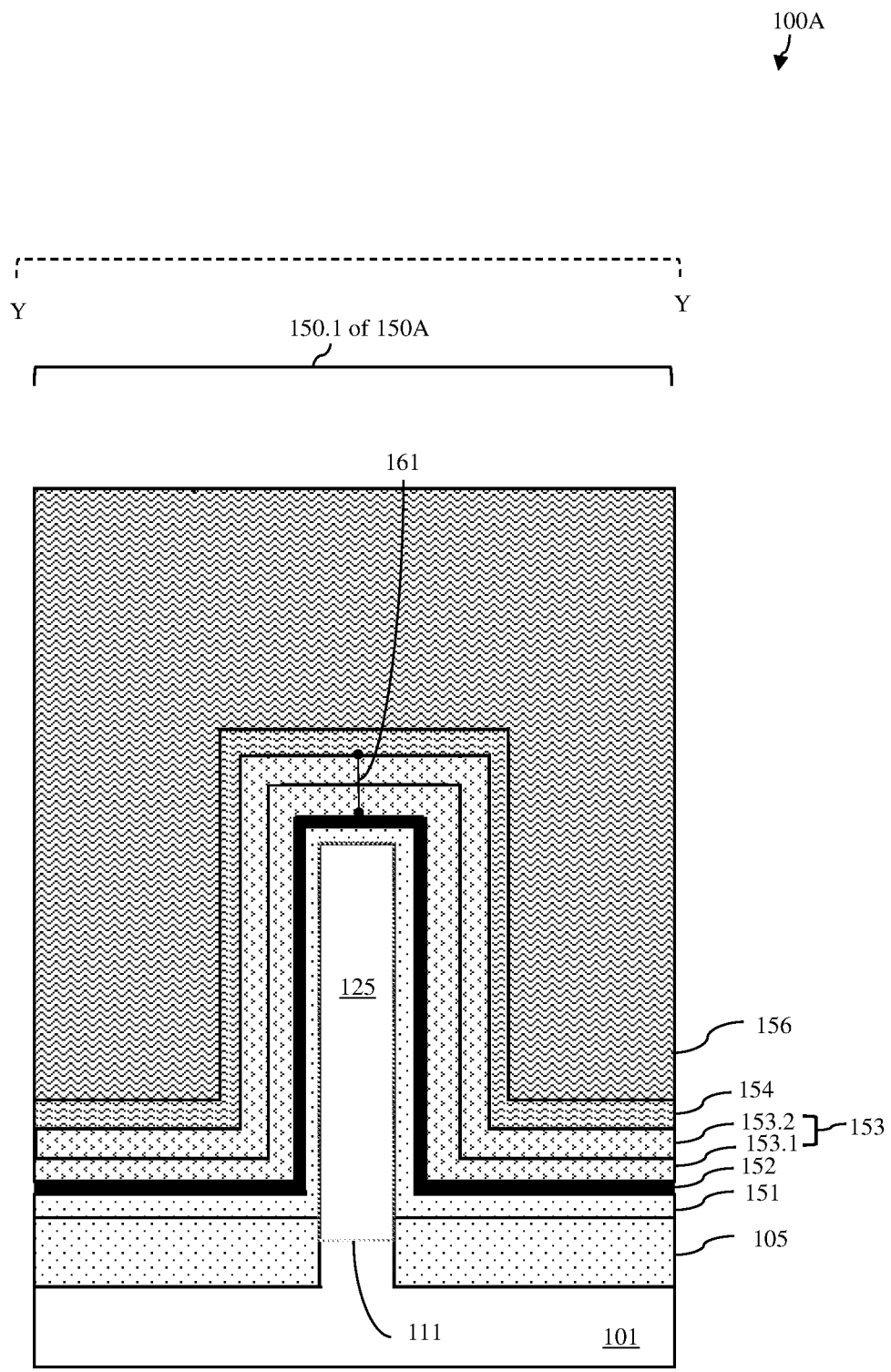
FIGS. 2-3 are additional cross-section diagrams further illustrating the LDMOSFET of FIG. 1A.
Figure 3:
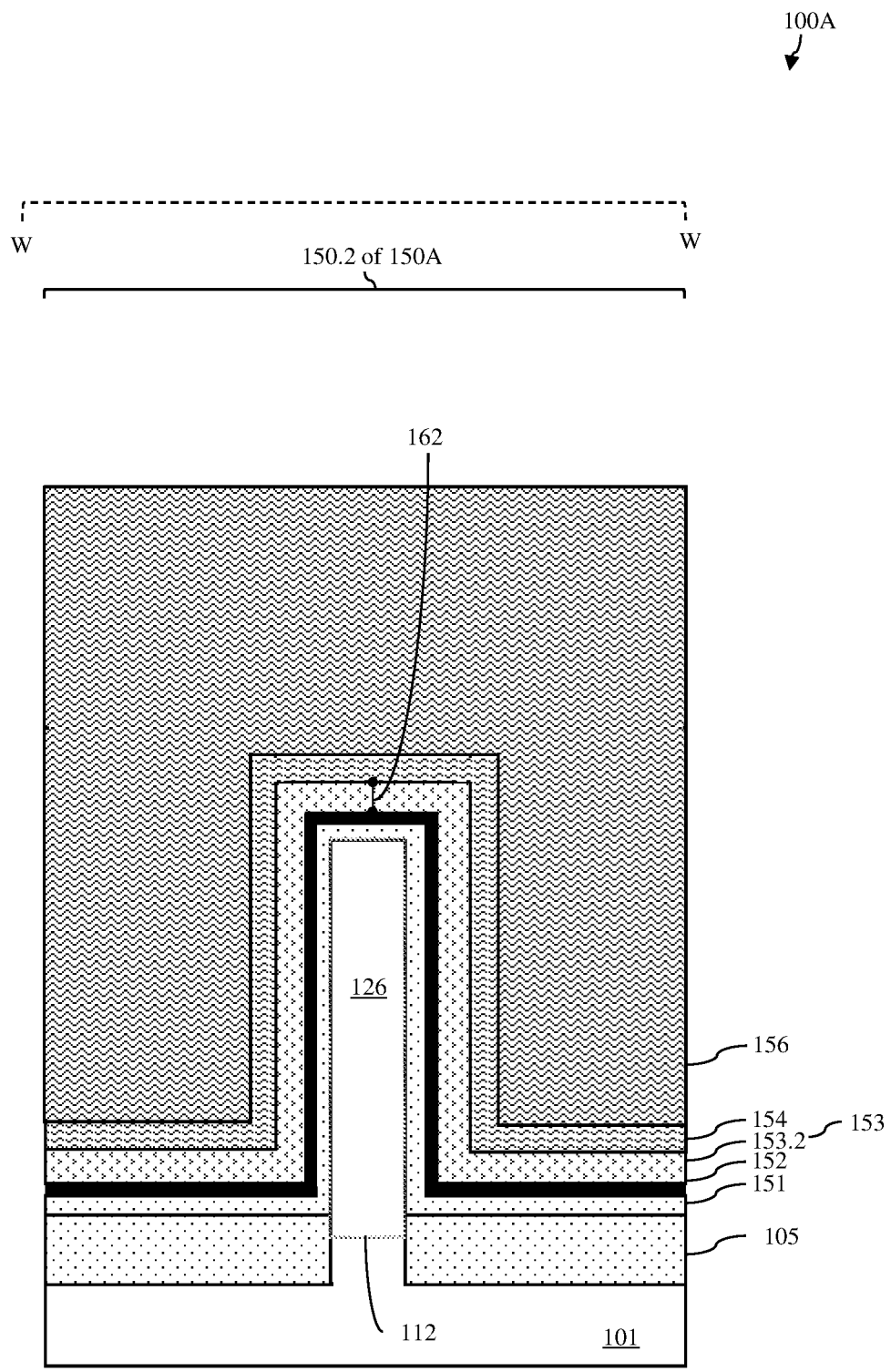

For a FINFET, this asymmetric RMG structure 150A-150C can be on the top surface and the opposing sides of the semiconductor body 110 (i.e., the semiconductor fin). For example, FIG. 2 is a widthwise cross-section diagram of the LDMOSFET 100A through the first section 150.1 of the asymmetric RMG structure 150A and the channel region 125 within the first-type well 111. FIG. 3 is a widthwise cross-section diagram of the LDMOSFET 100A through the second section 150.2 of the asymmetric RMG structure 150A and the drain drift region 112 within the second-type well 112. As illustrated, both the first section 150.1 and the second section 150.2 of the asymmetric RMG structure 150A are adjacent to the top surface and opposing sides of the semiconductor fin and are electrically isolated from the semiconductor substrate 101 below (e.g., by a buried isolation layer 105, such as a buried silicon dioxide layer or other suitable buried isolation layer). Although similar widthwise cross-section diagrams for the LDMOSFET 100B and 100C are not shown, it should be understood that the first section 150.1 and the second section 150.2 of the asymmetric RMG structures 150B and 150C would be similarly positioned on the top surface and opposing sides of the semiconductor fin. Those skilled in the art would recognize that placement of the RMG structure will vary in the case of a planar FET (e.g., only be on the top surface) or a GAAFET (e.g., on top, bottom and side surfaces).

The LDMOSFET 100A-100C can further include gate sidewall spacers 160 on opposing sidewalls of the RMG structure 150A-150C (e.g., near the interface between the source region 121 and the channel region 125 and above the trench isolation region 115 between the drain drift region 126 and the drain region 122, respectively). The gate sidewall spacers 160 can be made, for example, of silicon nitride, silicon carbon nitride, silicon boron carbon nitride or any other suitable gate sidewall spacer material.

The RMG structure 150A-150C can include an optional gate oxide layer 151 immediately adjacent to the semiconductor body 110 at the channel region 125 in the first-type well 111 (i.e., in the first section 150.1) and at the drain drift region 126 in the second-type well 112 (i.e., in the second section 150.2). The RMG structure 150A-150C can further include a gate dielectric layer 152. The gate dielectric layer 152 on the gate oxide layer 151. The gate dielectric layer 152 can be a high-K gate dielectric layer. Those skilled in the art will recognize that a high-K gate dielectric layer refers to a gate dielectric layer made of a dielectric material with a dielectric constant that is at least greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). As illustrated, the optional oxide layer 151 and gate dielectric layer 152 stack can each have an essentially uniform thickness across the first section 150.1 and the second section 150.2 of the RMG structure. Alternatively, the combined thickness of these layers may be different (e.g., thicker) in the first section 150.1 as compared to in the second section 150.2 (not shown).

The RMG structure 150A-150C can further include both a first-type work function layer 153 and a second-type work function layer 154. The first-type work function layer 153 can be immediately adjacent to and can conformally cover the gate dielectric layer 152 in both the first section 150.1 (i.e., aligned with the channel region 125) and the second section 150.2 (i.e., aligned with the drain drift region 126). The second-type work function layer 154 can be immediately adjacent to and can conformally cover the first-type work function layer 153 in both the first section 150.1 and the second section 150.2.

Those skilled in the art will recognize that the work function of a metal or metal alloy material typically refers to the minimum energy required to extract one electron from that material. The first-type work function layer 153 can be one or more metal or metal alloy layers having a first-type work function (i.e., a work function (eV) that falls within a first range) and the second-type work function layer 154 can be one or more metal or metal alloy layers having a second-type work function (i.e., a work function (eV) that falls within a second range that is different from the first range). Depending upon the conductivity type of the LDMOSFET 100A-100C, the first-type work function can be a P-type work function and the second-type work function can be an N-type work function or vice versa. Specifically, for an NFET, the first-type work function layer 153 can have a P-type work function and the second-type work function layer 154 can have an N-type work function. For a PFET, the first-type work function layer 153 can have an N-type work function and the second-type work function layer 154 can have a P-type work function.

For purposes of this disclosure, a P-type work function refers to a work function (eV) that is optimal for PFET operation and, particularly, refers to a work function (eV) within a range from about 4.9 eV to about 5.2 eV. Exemplary metals (and metal alloys) having such a P-type work function (i.e., having a work function that falls within the range of 4.9 eV to 5.2 eV include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). An N-type work function refers to a work function that is optimal for NFET operation and, particularly, refers to a work function within a range from about 3.9 eV to about 4.2 eV. Exemplary metals (and metal alloys) having such an N-type work function within the range of 3.9 eV to 4.2 eV include, but are not limited to, hafnium, zirconium, titanium, tantalum, aluminum, and alloys thereof, such as, hafnium carbide, zirconium carbide, titanium carbide, tantalum carbide, and aluminum carbide. Those skilled in the art will recognize that NFETs are often designed with RMG structures that include a P-type work-function layer, such as a layer of one of the above-mentioned metal nitrides (e.g., a layer of titanium nitride) between an N-type work function layer, such as an aluminum layer, and the gate dielectric layer to prevent penetration of the N-type work function material into the semiconductor body.

Additionally, as mentioned above, the RMG structure 150A-150C can be asymmetrically configured. Specifically, instead of the first-type work function layer 153 having a uniform thickness across the two sections 150.1 and 150.2, a first portion of the first-type work function layer 153 in the first section 150.1 can have a first thickness 161 and a second portion of the first-type work function layer 153 in the second section 150.2 can have a second thickness 162 that is less than the first thickness 161. The LDMOSFET embodiments disclosed herein vary with regard to the structural differences between the first portion and the second portion of the first-type work function layer 153.

In some embodiments, the first-type work function layer 153 can include multiple layers that have the first-type work function and at least some of the multiple layers can be patterned during processing so that the first portion of the first-type work function layer 153 has a greater number of layers than the second portion and, thus, is thicker than the second portion.

For example, in the RMG structure 150A in the LDMOSFET 100A of FIG. 1A and also in the RMG structure 150B in the LDMOSFET 100B of FIG. 1B, the first-type work function layer 153 includes a total of two layers 153.1-153.2 that have the first-type work function and only one of these two layers extends across both the first section 150.1 and the second section 150.2 of the RMG structure. That is, in the RMG structure 150A, the first layer 153.1 conformally covers and is immediately adjacent to only that portion of the gate dielectric layer 152 in the first section 150.1 aligned with the channel region 125 and it has one end 155 that is approximately aligned with the junction 127 between the two wells 111 and 112. The second layer 153.2 conformally covers and is immediately adjacent to the first layer 153.1 and also the portion of the gate dielectric layer 152 in the second section 150.2 aligned with the drain drift region 126.

In the RMG structure 150B, the first layer 153.1 conformally covers and is immediately adjacent to the gate dielectric layer 152 in both the first section 150.1 and the second section 150.2. The second layer 153.2 conformally covers and is immediately adjacent to only that portion of the first layer 153.1 in the first section 150.1 aligned with the channel region 125 and it has one end 157 that is approximately aligned with the junction 127 between the two wells 111 and 112. Thus, it does not extend over the portion of the first layer 153.1 in the second section 150.2.

In the above-described embodiments where the first-type work function layer includes multiple layers 153.1-153.2, the multiple layers 153.1-153.2 can be made of the same or different metal or metal alloys as long as they all have the first-type work function. For example, for an NFET, the multiple layers 153.1-153.2 can all made of the same P-type work function metal or metal alloy (e.g., titanium nitride or any other suitable P-type metal or metal alloy material). Alternatively, the multiple layers 153.1-153.2 can be made of at least two different P-type work function metal or metal alloy materials. For example, one layer (e.g., the layer that extends across both sections) can be made of titanium nitride and the other layer can be made of a different P-type metal or metal alloy material (e.g., titanium aluminum nitride, tantalum nitride, or any other suitable P-type work function metal or metal alloy material). Additionally, it should be understood that, while the RMG structures 150A and 150B each only show the first-type work function layer 153 as having a total of two layers, an asymmetric RMG structure could alternatively have a first-type work function layer with any number of layers as long as the second section has a lesser number of those layers than the first section in order to achieve the desired difference between the first thickness and the second thickness.

In other embodiments, the first-type work function layer 153 can be a single layer with the first-type work function. In the RMG structure 150C of the LDMOSFET 100C of FIG. 1C, the first-type work function layer 153 is a single conformal layer that is immediately adjacent to and covers the gate dielectric layer 152. During processing, that portion of the first-type work function layer 150 that is within the second section 150.2 is etched back (i.e., recessed) to achieve the different thicknesses.

In any case, as mentioned above, the RMG structure 150A-150C can further include a second-type work function layer 154 on the first-type work function layer 153 in both the first and second sections of the RMG structure. For an NFET, the second-type work function layer 154 is an N-type work function layer. In some embodiments, this N-type work function layer can be aluminum, or some other metal or metal alloy with the P-type work function. The RMG structure 150A-150C can also include conductive fill material 156 on the second-type work function layer 154 in the first section 150.1 and the second section 150.2. This conductive fill material 156 can be any suitable fill metal or fill metal alloy, such as tungsten, a tungsten alloy (e.g., tungsten silicide or titanium tungsten), cobalt, aluminum or any other suitable fill metal or fill metal alloy.

In the above-described asymmetric RMG structures 150A-150C, a work function layer 154 that is optimal for the performance of the FET given its conductivity type and, particularly, the second-type work function layer 154 is in both the first section 150.1 adjacent to the channel region 125 and the second section 150.2 adjacent to the drain drift region 126, but it is separated from the gate dielectric layer 152 by a work function layer that is not optimal for the performance of the FET (i.e., by the first-type work function layer 153). As a result, the threshold voltage (Vt) of the FET is raised over what it would otherwise be without the first-type work function layer 153. Furthermore, since the first-type work function layer 153 is thicker in the first section 150.1 than it is in the second section 150.2, a first threshold voltage (Vt1) at the first section 150.1 of the RMG structure 150A-150C adjacent to the channel region 125 is greater than a second threshold voltage (Vt2) at the second section 150.2 of the RMG structure 150A-150C adjacent to the drain drift region 126 and the LDMOSFET has a greater breakdown voltage (BV) (e.g., as compared to a LDMOSFET with a symmetric gate with identical layers in the two sections).

Figure 4:
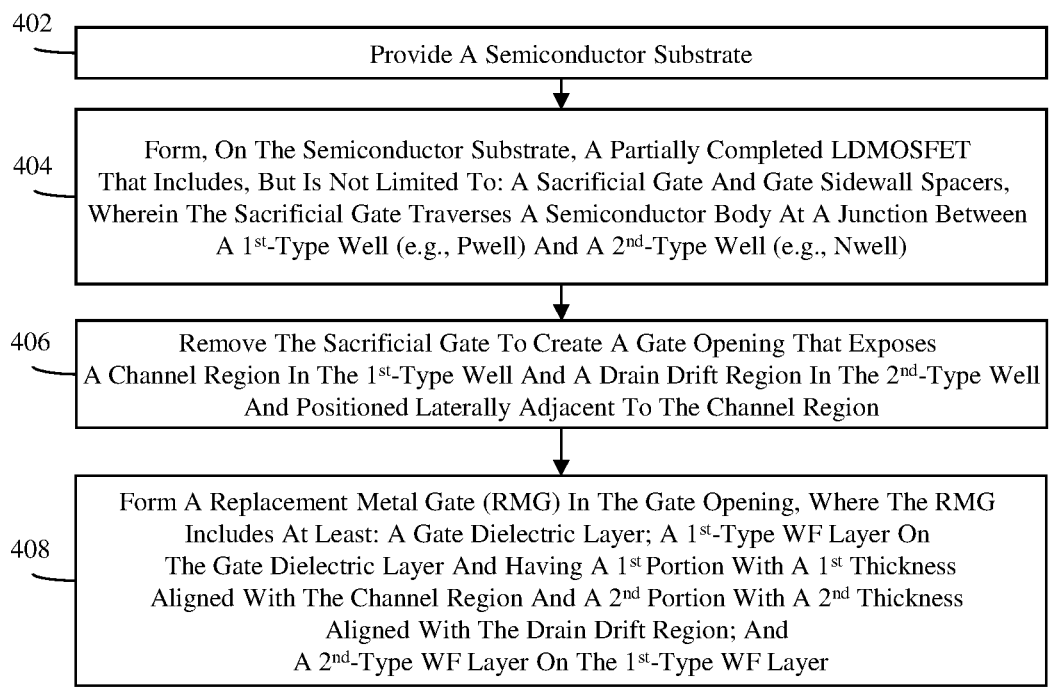
FIG. 4 is a flow diagram illustrating method embodiments for forming an LDMOSFET with an asymmetric RMG structure.

Referring to the flow diagram of FIG. 4, also disclosed herein are method embodiments for forming lateral double-diffused metal oxide semiconductor field effect transistors (LDMOSFETs), such as the LDMOSFETs 100A-100C described above and illustrated in FIGS. 1A-1C.

For purposes of illustration, the disclosed method embodiments are described below and illustrated in the Figures with respect to the formation of a non-planar FET and, particularly, a fin-type FET (FINFET)). However, it should be understood that the salient aspects of the present invention are directed to the asymmetric characteristics of the replacement metal gate (RMG) structure and the Figures showing FINFET formation are not intended to be limiting. The same method techniques disclosed herein for forming the asymmetric RMG could be employed, for example, during formation of a planar FET, a gate-all-around FET (GAAFET), etc.

Figure 5:
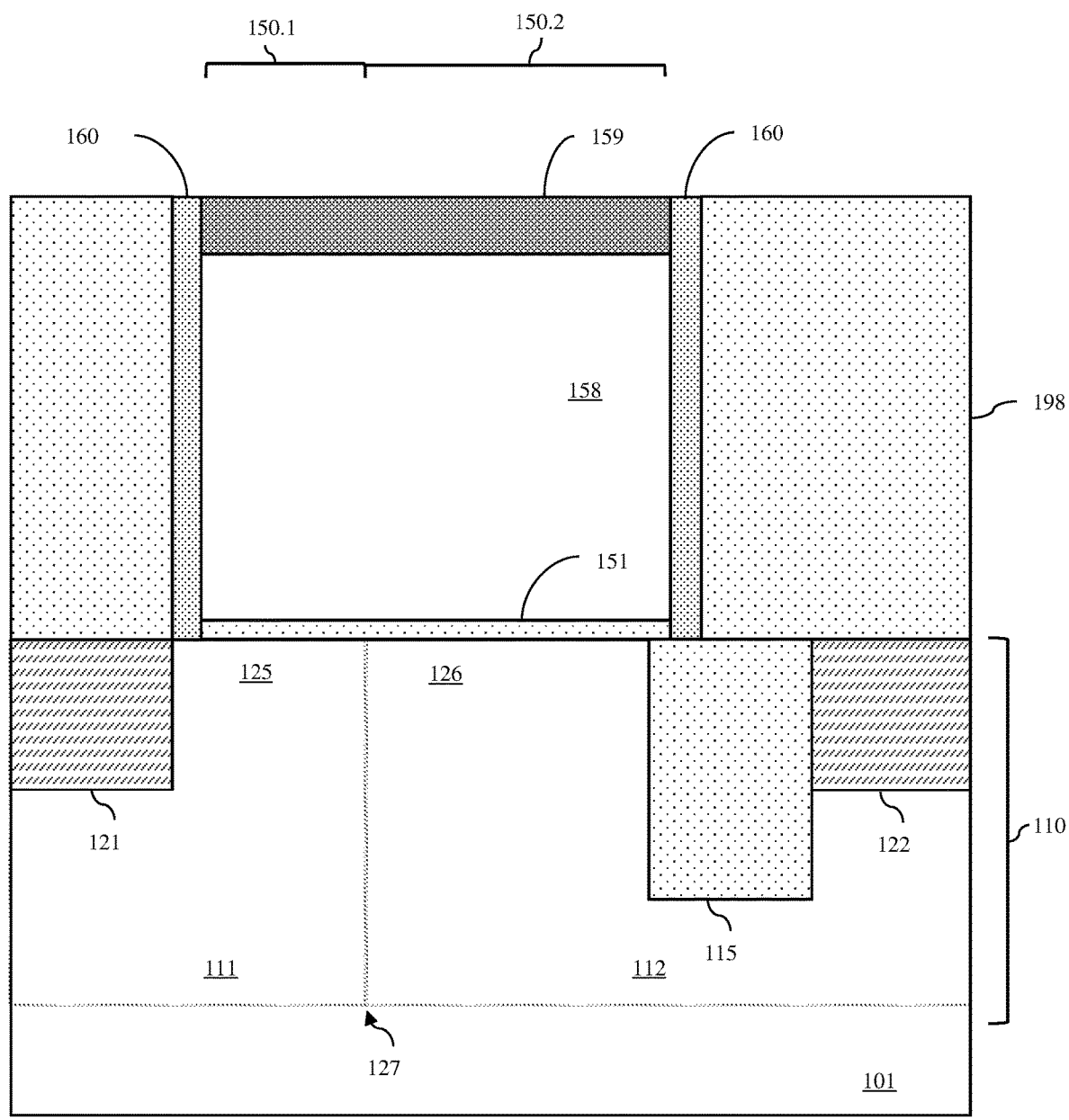
FIGS. 5-7 are cross-section diagrams illustrating partially completed LDMOSFETs formed according to the flow diagram of FIG. 4.

In any case, the method can include providing a semiconductor substrate 101 (see process step 402) and using conventional processing techniques to form, on the semiconductor substrate, a partially completed LDMOSFET structure that is ready for RMG processing (see process step 404 and FIG. 5).

The partially completed LDMOSFET structure can include a semiconductor body 110 (e.g., a semiconductor fin) and, within the semiconductor body, a first-type well 111 and a second-type well 112 positioned laterally immediately adjacent to the first-type well 111. As discussed above with regard to the structure embodiments, the terms "first-type" and "second-type" are referred to throughout this specification and the meaning of "first-type" and "second-type" will be vary depending upon whether the LDMOSFET being formed is an N-type FET (NFET) or a P-type FET (NFET). For an NFET, "first-type" means P-type and "second-type" means N-type. For a PFET, "first-type" means N-type and "second-type" means P-type. Thus, for example, for an NFET, the dopant implantation processes can be performed so that the first-type well is a P-type well (Pwell) and the second-type well, which is positioned laterally immediately adjacent to the first-type well, is an N-type well (Nwell). Portions of the first-type well 111 and the second-type well 112 immediately adjacent to the junction 127 between the two wells 111 and 112 form a channel region 125 and a drain drift region 126, respectively.

The partially completed LDMOSFET structure can further include a source region 121 and a drain region 122. The source region 121 can be in contact with the first-type well 111 and positioned laterally adjacent to the channel region 125. The drain region 122 can be in contact with the second-type well 112 and positioned laterally adjacent to the drain drift region 126. Thus, across the length of the LDMOSFET 100A-100C, the channel region 125 is positioned laterally adjacent to the source region 121, the drain drift region 126 is positioned laterally adjacent to the channel region 125 such that the channel region 125 is between the source region 121 and the drain drift region 126, and the drain region 122 is positioned laterally adjacent to the drain drift region 126 such that the drain drift region 126 is between the channel region 125 and the drain region 122. The source and drain regions 121-122 can have the second-type conductivity at a higher conductivity level than the second-type well. Thus, for an NFET, the source and drain regions 121-122 can be N+ source/drain regions.

Optionally, the partially completed LDMOSFET structure can further include a trench isolation region 115 in the second-type well 112 positioned laterally between the drain drift region 126 and the drain region 122. The trench isolation region 115 can include a trench, which extends vertically into the semiconductor body 110 between the drain and drain drift regions and which is filled with one or more layers of isolation material (e.g., silicon dioxide or other suitable isolation material). The bottom of the trench isolation region 115 should be at some depth above the level of the bottom of the second-type well 112 to allow for a current path through the second-type well 112 to the drain region 122.

The partially completed LDMOSFET structure can further include a sacrificial gate structure adjacent to the semiconductor body 110 at the junction 127 between the first-type well 111 and the second-type well 112. The sacrificial gate structure can include an optional oxide layer 151 and a sacrificial gate layer 158 on the oxide layer 151. The sacrificial gate layer 158 can be, for example, a polysilicon layer, an amorphous silicon layer or any other suitable sacrificial gate material that is different from the semiconductor body material and that can be selectively etched away from the semiconductor body during subsequent processing. A sacrificial gate structure can further include a sacrificial gate cap layer 159 (e.g., a silicon nitride cap layer) on the top surface of the sacrificial gate layer 158. These layers can be lithographically patterned and etched to form the sacrificial gate structure on a portion of the first-type well 111, which is adjacent to the junction 127 and which will make up the channel region 125, and further extending over a portion of the second-type well 112, which will make up the drain drift region 126 and which abuts the channel region 125. For a FINFET, this sacrificial gate 158 will be formed adjacent to the top surface and opposing sides of the semiconductor fin above the buried isolation layer 105.

The partially completed LDMOSFET structure can further include gate sidewall spacers 160 on opposing sidewalls of the sacrificial gate layer 158 and sacrificial gate cap layer 159 on the sacrificial gate layer 158. The gate sidewall spacers 160 can, for example, be made of silicon nitride, silicon carbon nitride, silicon boron carbon nitride or any other suitable gate sidewall spacer material that is different from the material used for the sacrificial gate layer 158.

The partially completed LDMOSFET structure can further include a source region 121 and a drain region 122. The source region 121 can be in contact with the first-type well 111 and positioned laterally adjacent to the channel region 125. The drain region 122 can be in contact with the second-type well 112 and positioned laterally adjacent to the drain drift region 126. Thus, across the length of the LDMOSFET 100A-100C, the channel region 125 is positioned laterally adjacent to the source region 121, the drain drift region 126 is positioned laterally adjacent to the channel region 125 such that the channel region 125 is between the source region 121 and the drain drift region 126, and the drain region 122 is positioned laterally adjacent to the drain drift region 126 such that the drain drift region 126 is between the channel region 125 and the drain region 122. The source and drain regions 121-122 can have the second-type conductivity at a higher conductivity level than the second-type well. Thus, for an NFET, the source and drain regions 121-122 can be N+ source/drain regions.

The partially completed LDMOSFET structure can further include a blanket dielectric layer 198 (e.g., a silicon dioxide (SiO$_2$) layer) covering the source and drain regions 121-122 and positioned laterally adjacent to the gate sidewall spacers 160.

Optionally, the partially completed LDMOSFET structure can include metal plugs (not shown) that extend through the dielectric layer 198 to the source and drain regions 121-122. If the partially completed LDMOSFET does not include the metal plugs at the end of process step 404, they can be following replacement metal gate (RMG) formation.

Various different techniques for forming the above-mentioned features of the partially completed LDMOSFET are well known in the art and, thus, the details of these techniques have been omitted from this specification in order to allow the reader to focus on the salient aspects of the disclosed embodiments.

Figure 6:
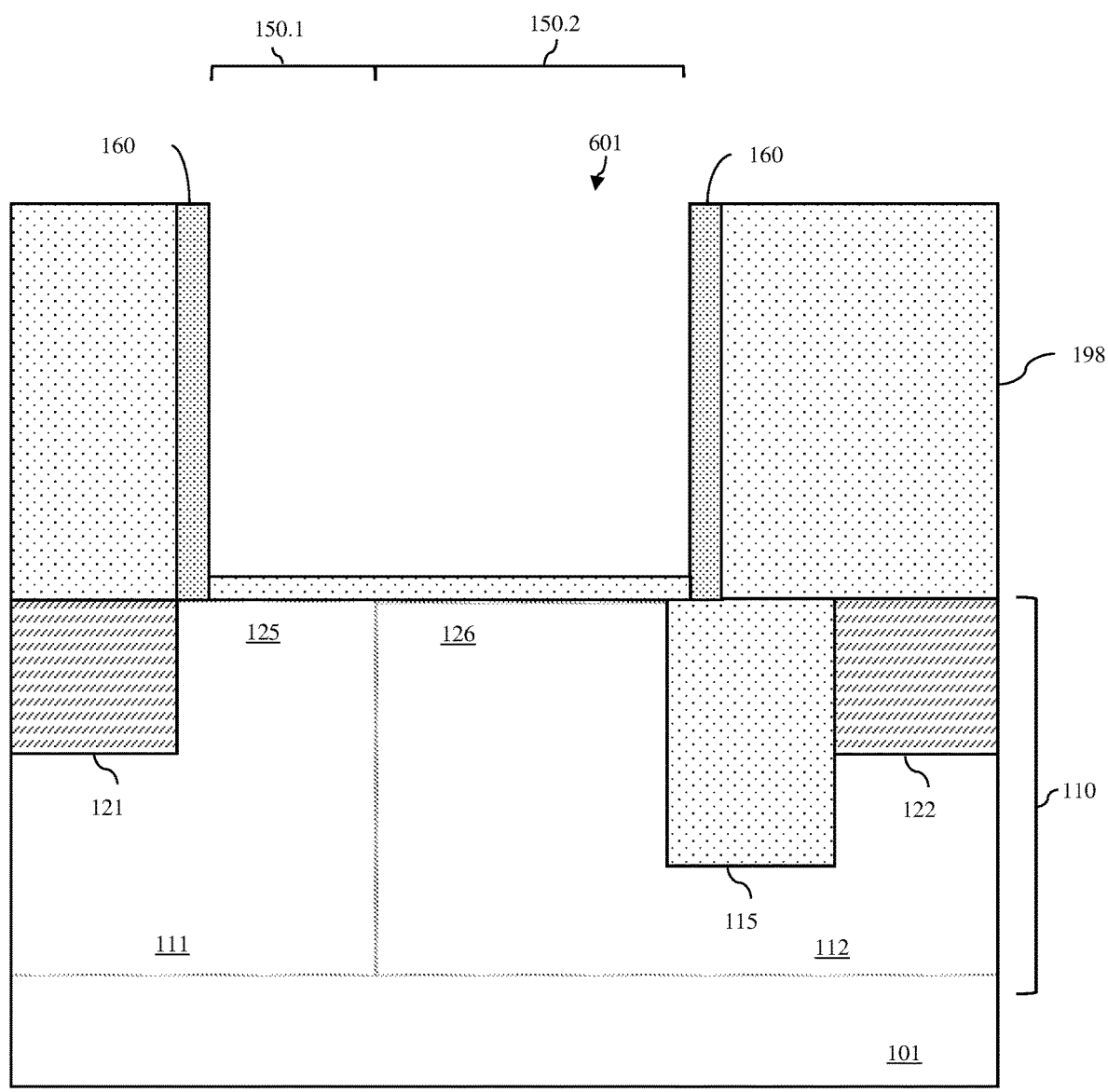

The method can further include removing the sacrificial gate structure to create a gate opening 601 that exposes the semiconductor body 110 at the junction between the first-type well and the second-type well 112 and, particularly, at the junction between the channel region 125 and the drain drift region 126 in those wells (see process step 406 and FIG. 6). For example, a polishing process (e.g., a chemical mechanical polishing (CMP) process) can be performed to remove the sacrificial gate cap 159 and expose the top surface of the sacrificial gate layer 158. Then, a selective etch process can be performed to selectively etch away the material of the sacrificial gate layer 158 without significantly impacting the semiconductor body or exposed dielectric material (e.g., the gate sidewall spacers 160, the blanket dielectric layer 198, etc.). For a FINFET, removal of the sacrificial gate structure will expose the top surface and opposing sidewalls of the semiconductor fin at the junction between the channel region 125 and drain drift region 126.

The method can further include forming an asymmetric replacement metal gate (RMG) structure (e.g., 150A, 150B or 150C) in the gate opening 601 on the semiconductor body 110 at the junction between the first-type well 111 and the second-type well 112 such that a first section 150.1 of the RMG structure traverses the semiconductor body 110 adjacent to the channel region 125, such that a second section 150.2 of this RMG structure traverses the semiconductor body 110 adjacent to the drain drift region 126, and such that the first section 150.1 is different from the second section 150.2 (see process step 408 and FIG. 1A, 1B or 1C). For a FINFET, this asymmetric RMG structure 150A, 150B or 150C will be formed adjacent to the top surface and the opposing sides of the semiconductor body 110 (i.e., the semiconductor fin). For example, FIGS. 2 and 3, which are discussed in greater detail above with regard to the structure, show a widthwise cross-section of the first section 150.1 of the asymmetric RMG structure 150A on the top surface and opposing sides of the semiconductor fin at the channel region and another widthwise cross-section of the second section 150.2 through the RMG structure 150A on the top surface and opposing sidewalls of the semiconductor fin the drain drift region 112. Those skilled in the art would recognize that placement of the gate structure will vary in the case of a planar FET (e.g., only be on the top surface) or a GAAFET (e.g., on top, bottom and side surfaces).

Figure 7:
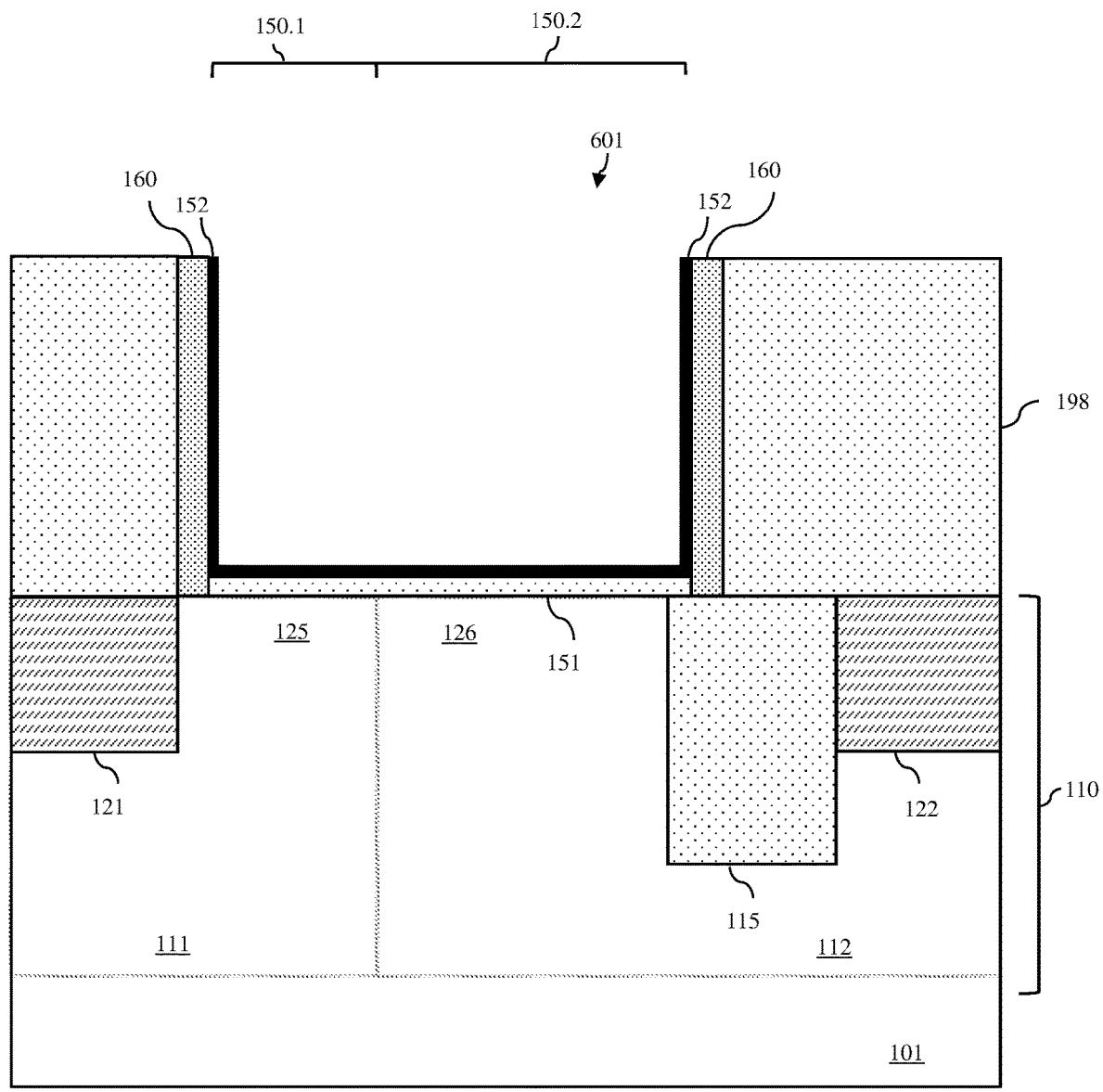

More particularly, formation of this asymmetric RMG structure (e.g., 150A, 150B or 150C) at process step 408 can include forming (e.g., conformally depositing) a gate dielectric layer 152 in the gate opening 601 (see FIG. 7). The gate dielectric layer 152 can be a high-K gate dielectric layer. Those skilled in the art will recognize that a high-K gate dielectric layer refers to a gate dielectric layer made of a dielectric material with a dielectric constant that is at least greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). As illustrated, the optional oxide layer 151 and gate dielectric layer 152 can each have an essentially uniform thickness across the first section 150.1 and the second section 150.2 of the RMG structure. Alternatively, the combined thickness of these layers may be different (e.g., thicker) in the first section 150.1 as compared to in the second section 150.2 (not shown).

Formation of this asymmetric RMG structure at process 408 can further include forming a first-type work function layer 153 in the gate opening 601 on the gate dielectric layer 152 and a second-type work function layer 154 on the first-type work function layer 153.

As discussed above with regard to the structure embodiments, the work function of a metal or metal alloy material typically refers to the minimum energy required to extract one electron from that material. The first-type work function layer 153 can be one or more metal or metal alloy layers having a first-type work function (i.e., a work function (eV) that falls within a first range) and the second-type work function layer 154 can be one or more metal or metal alloy layers having a second-type work function (i.e., a work function (eV) that falls within a second range that is different from the first range). Depending upon the conductivity type of the LDMOSFET being formed, the first-type work function can be a P-type work function and the second-type work function can be an N-type work function or vice versa. Specifically, for an NFET, the first-type work function layer 153 can have a P-type work function and the second-type work function layer 154 can have an N-type work function. For a PFET, the first-type work function layer 153 can have an N-type work function and the second-type work function layer 154 can have a P-type work function.

Also as discussed above with regard to the structure embodiments, a P-type work function refers to a work function that is optimal for PFET operation and, particularly, refers to a work function within the range of about 4.9 eV to about 5.2 eV. Exemplary metals (and metal alloys) having such the P-type work function in the range of 4.9 eV to 5.2 eV include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). An N-type work function refers to a work function that is optimal for NFET operation and, particularly, refers to a work function in the range of about 3.9 eV to about 4.2 eV. Exemplary metals (and metal alloys) having such the N-type work function with the range of 3.9 eV to 4.2 eV include, but are not limited to, hafnium, zirconium, titanium, tantalum, aluminum, and alloys thereof, such as, hafnium carbide, zirconium carbide, titanium carbide, tantalum carbide, and aluminum carbide. Those skilled in the art will recognize that NFETs are often designed with RMG structures that include a P-type work-function layer, such as a layer of one of the above-mentioned metal nitrides (e.g., a layer of titanium nitride) between an N-type work function layer, such as an aluminum layer, and the gate dielectric layer to prevent penetration of the N-type work function material into the semiconductor body.

In any case, the first-type work function layer 153 can be formed so that it has different portions with different thicknesses and, particularly, so that it has a first portion with a first thickness 161 in the first section 150.1 of the RMG structure (i.e., aligned with the channel region 125) and so that it has a second portion with a second thickness 162, which is less than the first thickness 161, in the second section 150.1 of the RMG structure (i.e., aligned with the drain drift region 126). Various different techniques could be employed to achieve the different thicknesses 161-162 in the different portions of the first-type work function layer 153.

In some embodiments, formation of the first-type work function layer 153 can include depositing multiple layers that have the first-type work function and patterning at least some of the multiple layers so that the first portion of the first-type work function layer 153 has a greater number of layers than the second portion and, thus, so that the first portion is thicker than the second portion.

Figure 8:
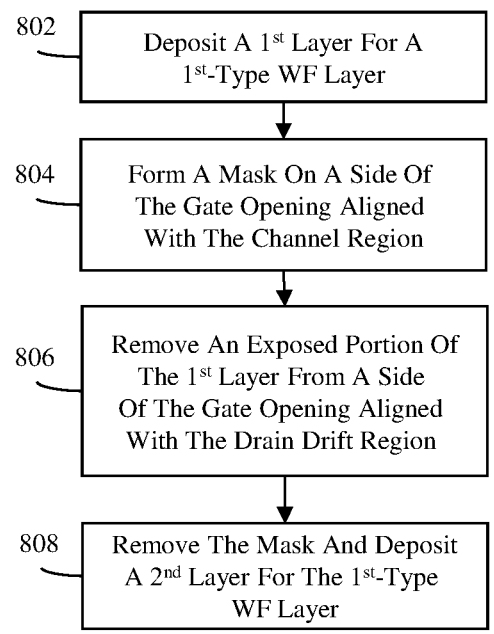
FIG. 8 is a flow diagram illustrating an exemplary process flow A for forming the first-type work function layer of the asymmetric RMG structure of the LDMOSFET of FIG. 1A.
Figure 9A:
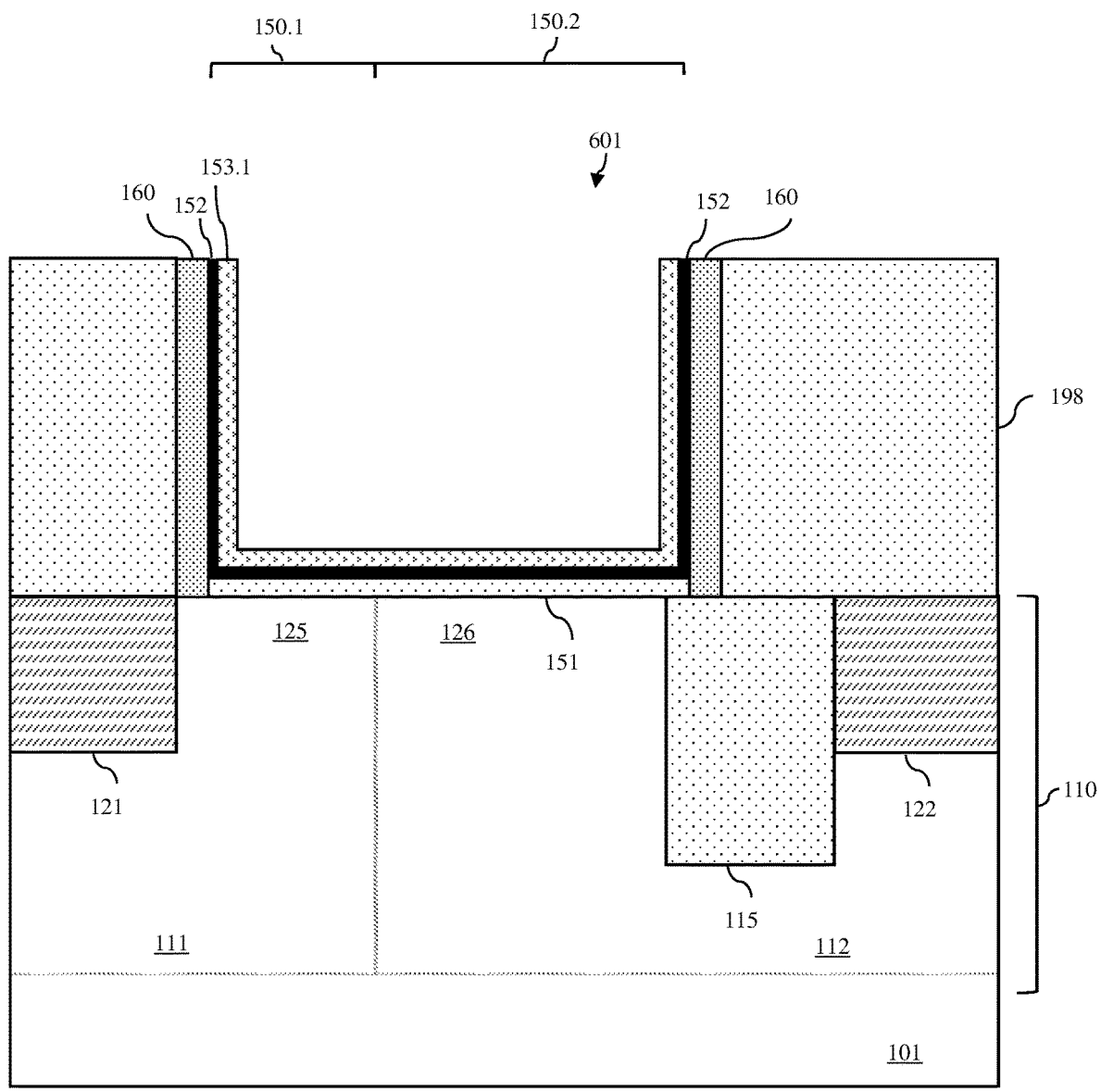
FIGS. 9A-9C are cross-section diagrams illustrating partially completed LDMOSFETs formed according to the flow diagram of FIG. 8.
Figure 9B:
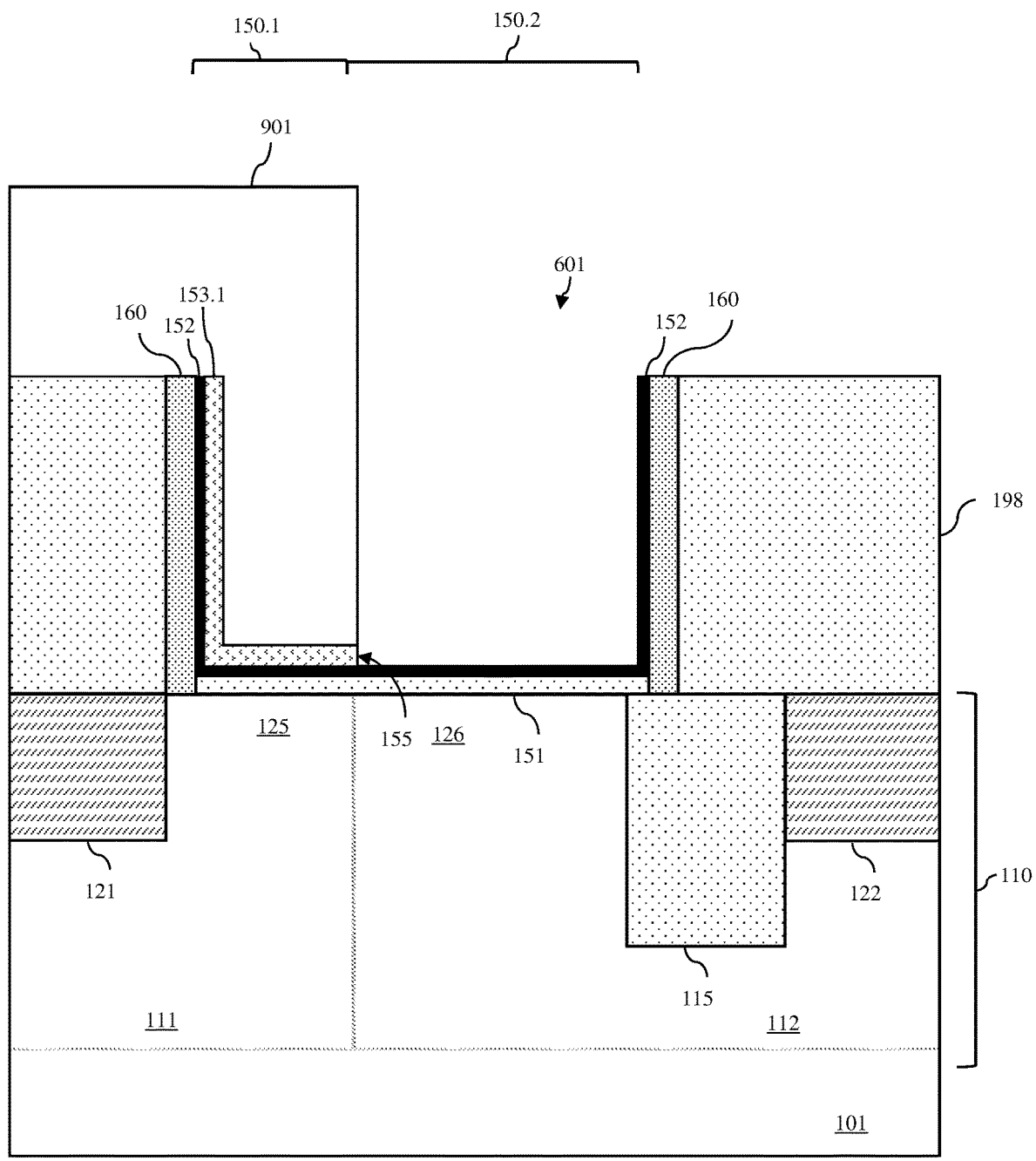
Figure 9C:
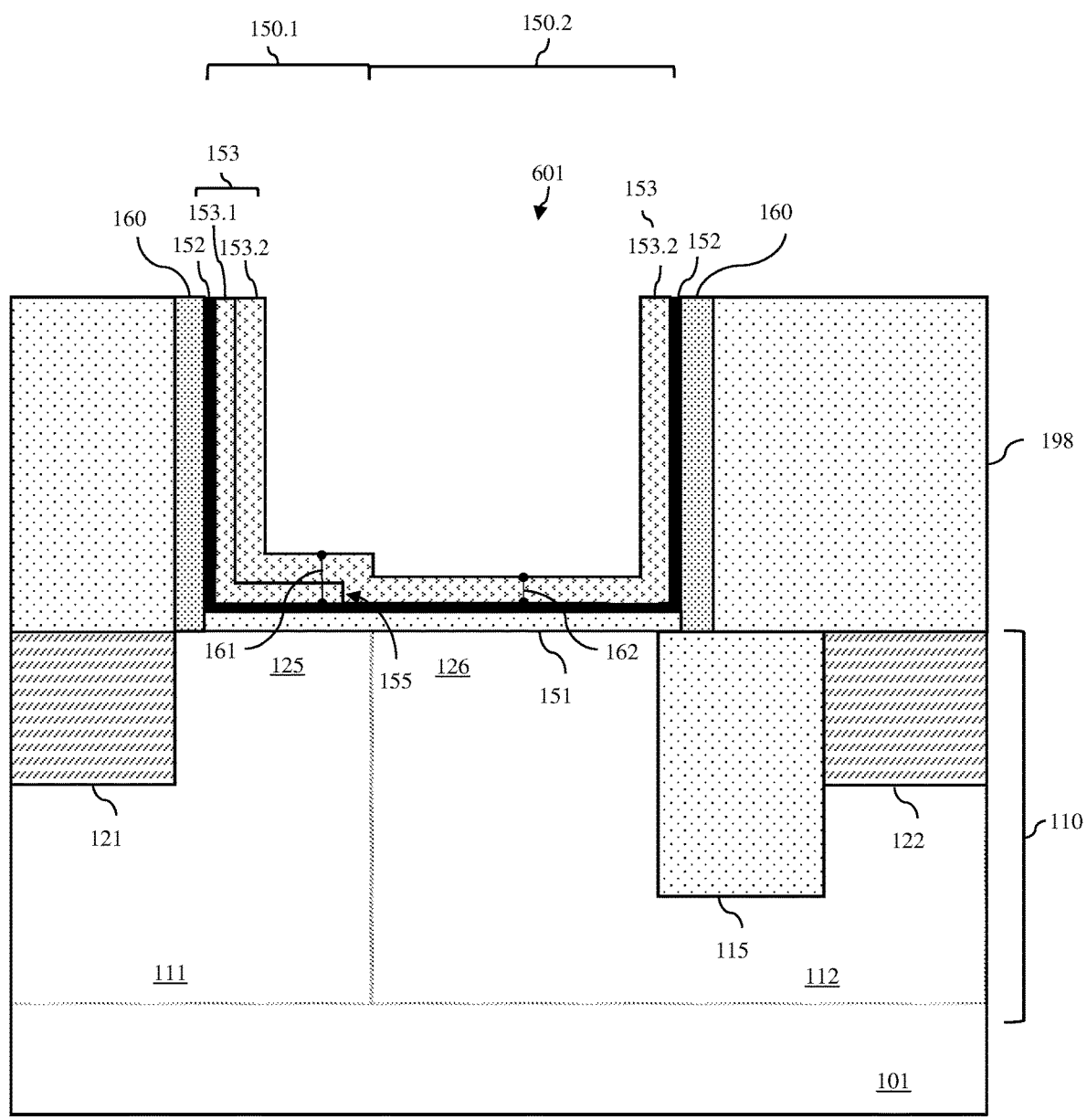

FIG. 8 is a flow diagram illustrating one exemplary process flow A for forming the multi-layer first-type work function layer shown in the asymmetric RMG structure 150A of the LDMOSFET 100A of FIG. 1A. In this process flow A, a first layer 153.1 with the first-type work function can be conformally deposited into the gate opening 601 so that it covers the gate dielectric layer 152 (see process step 802 and FIG. 9A). A mask layer 901 can be deposited and patterned so that it is in the gate opening 601 on the portion of first layer 153.1 aligned with the channel region 125 and so that the portion of the first layer 153.1 aligned with the drain drift region 126 is exposed (see process step 804). The mask layer 901 can be, for example, a photoresist layer or a hardmask layer (e.g., a silicon nitride hard mask layer) and can be patterned using, for example, conventional lithographic patterning and etch techniques. A selective etch process can be performed to remove the exposed portion of the first layer 153.1, stopping on the gate dielectric layer 152 (see process step 806 and FIG. 9B). Thus, the remaining portion of the first layer 153 will only be in the first section 150.1 of the RMG structure and will have one end 155 that is approximately aligned with the junction 127 between the two wells 111 and 112. The mask layer 901 can then be removed and a second layer 153.2 with the first-type work function can be conformally deposited so that it covers and is immediately adjacent to the first layer 153.1 in the first section 150.1 and also immediately adjacent to the gate dielectric layer 152 in the second section 150.2 (see process step 808 and FIG. 9C).

Figure 10:
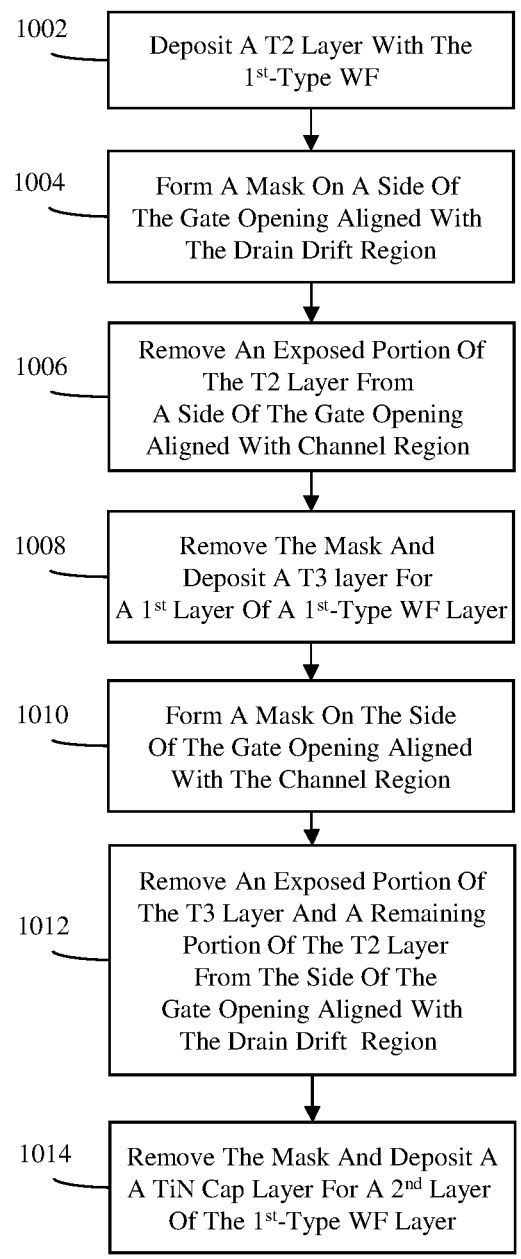
FIG. 10 is a flow diagram illustrating another exemplary process flow B for forming the first-type work function layer of the asymmetric RMG structure of the LDMOSFET of FIG. 1A.

FIG. 10 is a flow diagram illustrating another exemplary process flow B for forming the multi-layer first-type work function layer shown in the asymmetric RMG structure 150A of the LDMOSFET 100A of FIG. 1A. This process flow B is specifically designed to be readily integrated into a known process flow that includes deposition and patterning of multiple different layers that have the P-type work function (e.g., multiple titanium nitride layers including, for example, a T2 layer, a T3 layer, and a TiN cap layer) when concurrently forming RMGs for NFETs with different threshold voltages (Vts) (e.g., a super low threshold voltage (SLVT) NFET(s) and a regular threshold voltage (RVT) NFET(s)) as well as RVT PFET(s) on the same semiconductor substrate. The known process flow includes conformally depositing a T2 layer into the gate openings for the SLVT NFET(s), RVT NFET(s) and RVT PFET(s). The T2 layer is patterned so that it is removed from the gate openings of the SLVT and RVT NFETs, leaving it in the gate opening(s) of RVT PFET(s). Then, a T3 layer is conformally deposited into the gate openings for SLVT NFET(s), RVT NFET(s) and RVT PFET(s). The T3 layer is patterned so that it is removed from the gate opening(s) for the SLVT NFET(s), leaving it in the gate openings of the RVT NFET(s) and RVT PFET(s). Then, a TiN cap layer is conformally deposited into the gate openings for the SLVT NFET(s), RVT NFET(s) and RVT PFET(s). Thus, each SLVT NFET will have a single layer of TiN (i.e., the TiN cap layer) and the RVT NFETs will have two layers of TiN (i.e., the T3 and TiN cap layers).

Figure 11A:
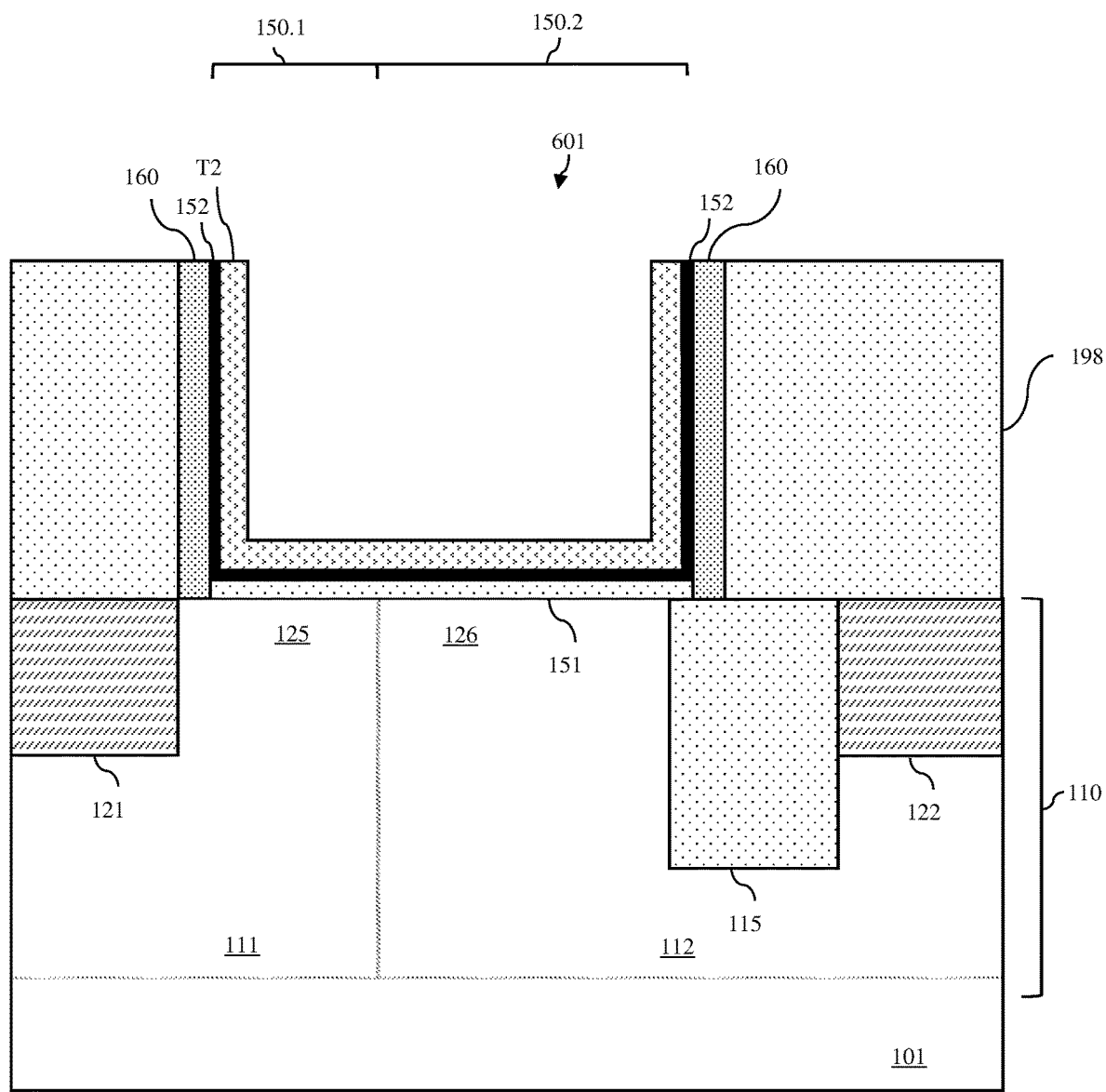
FIGS. 11A-11E are cross-section diagrams illustrating partially completed LDMOSFETs formed according to the flow diagram of FIG. 10.
Figure 11B:
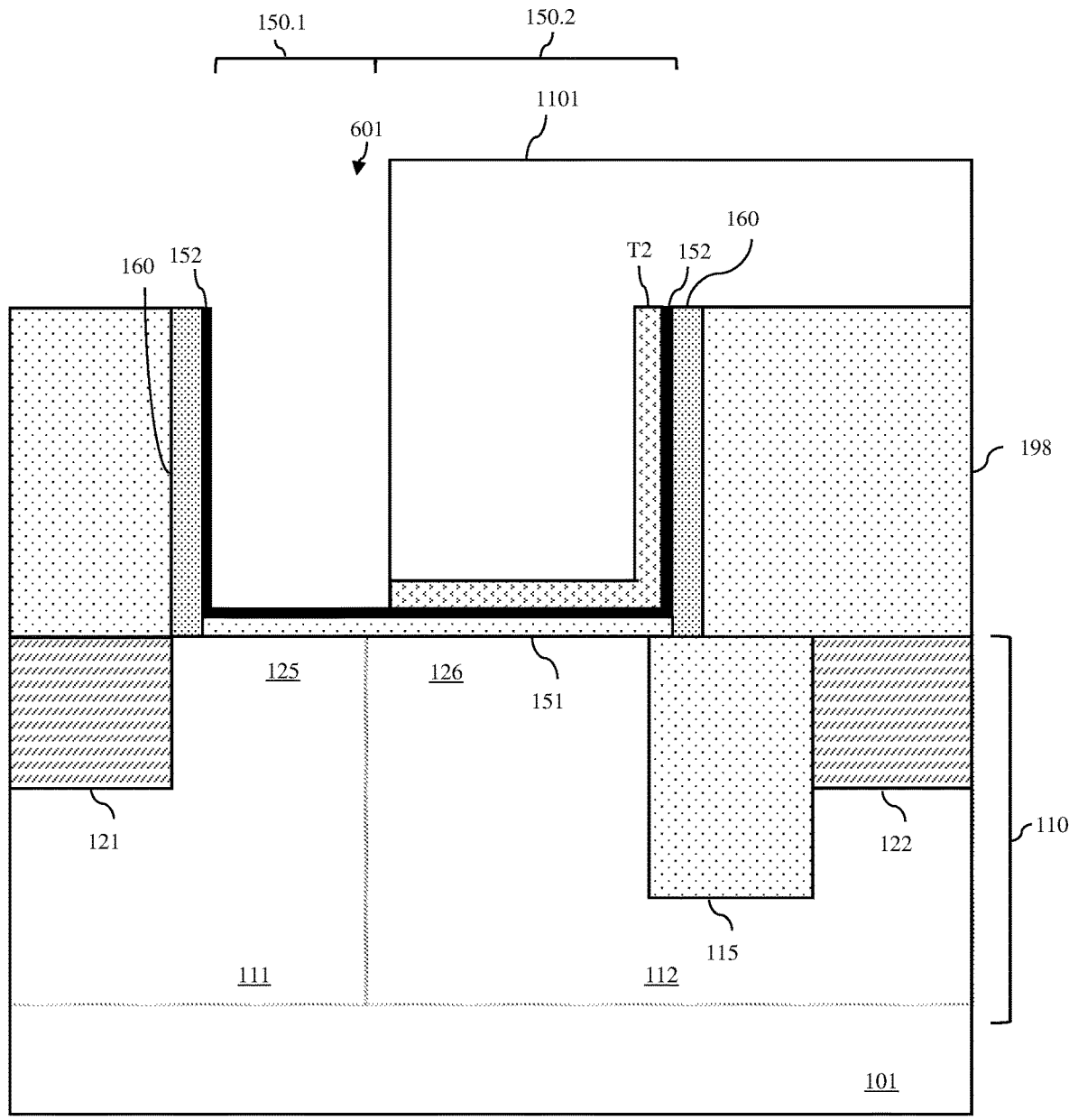
Figure 11C:
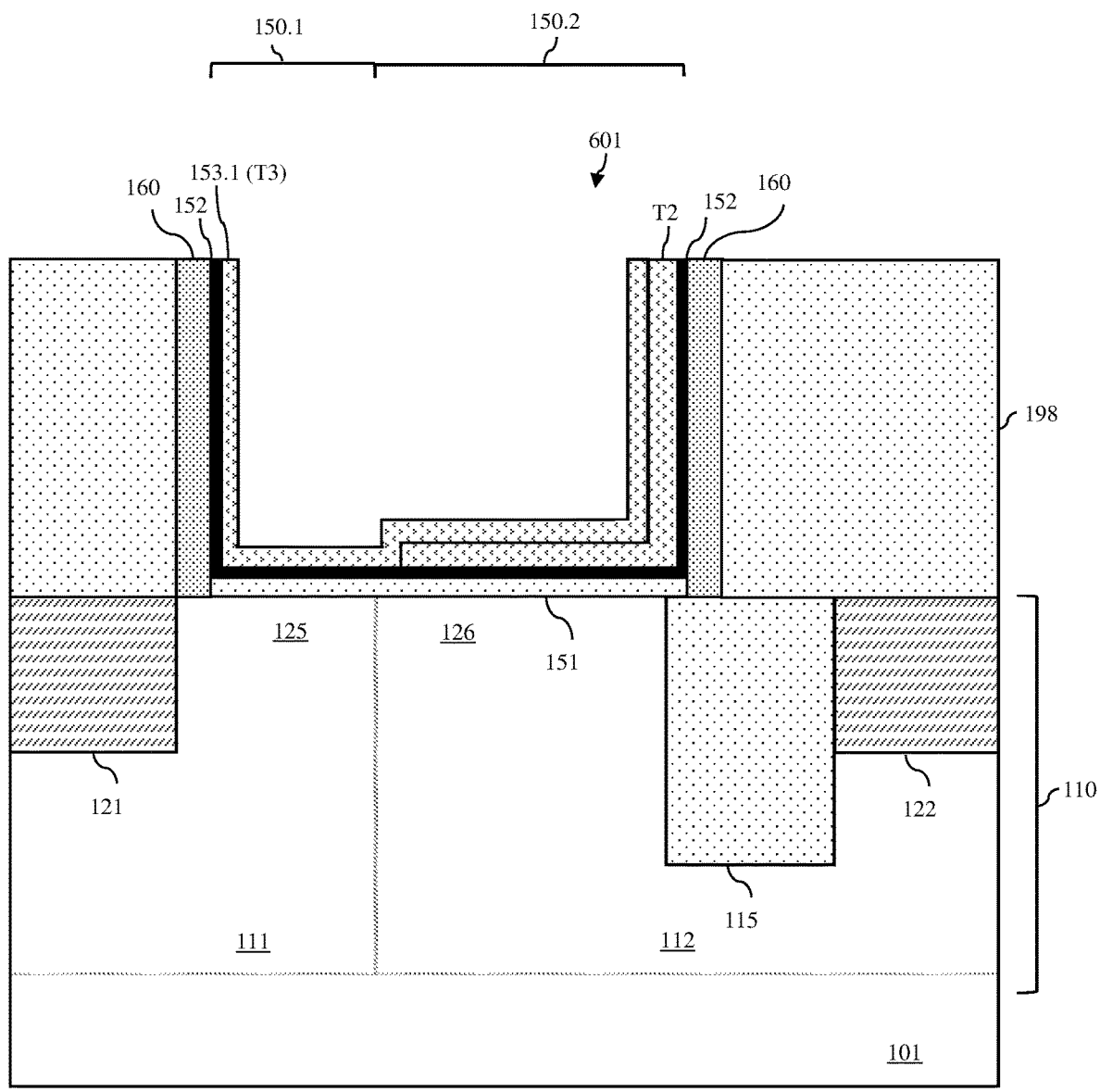
Figure 11D:
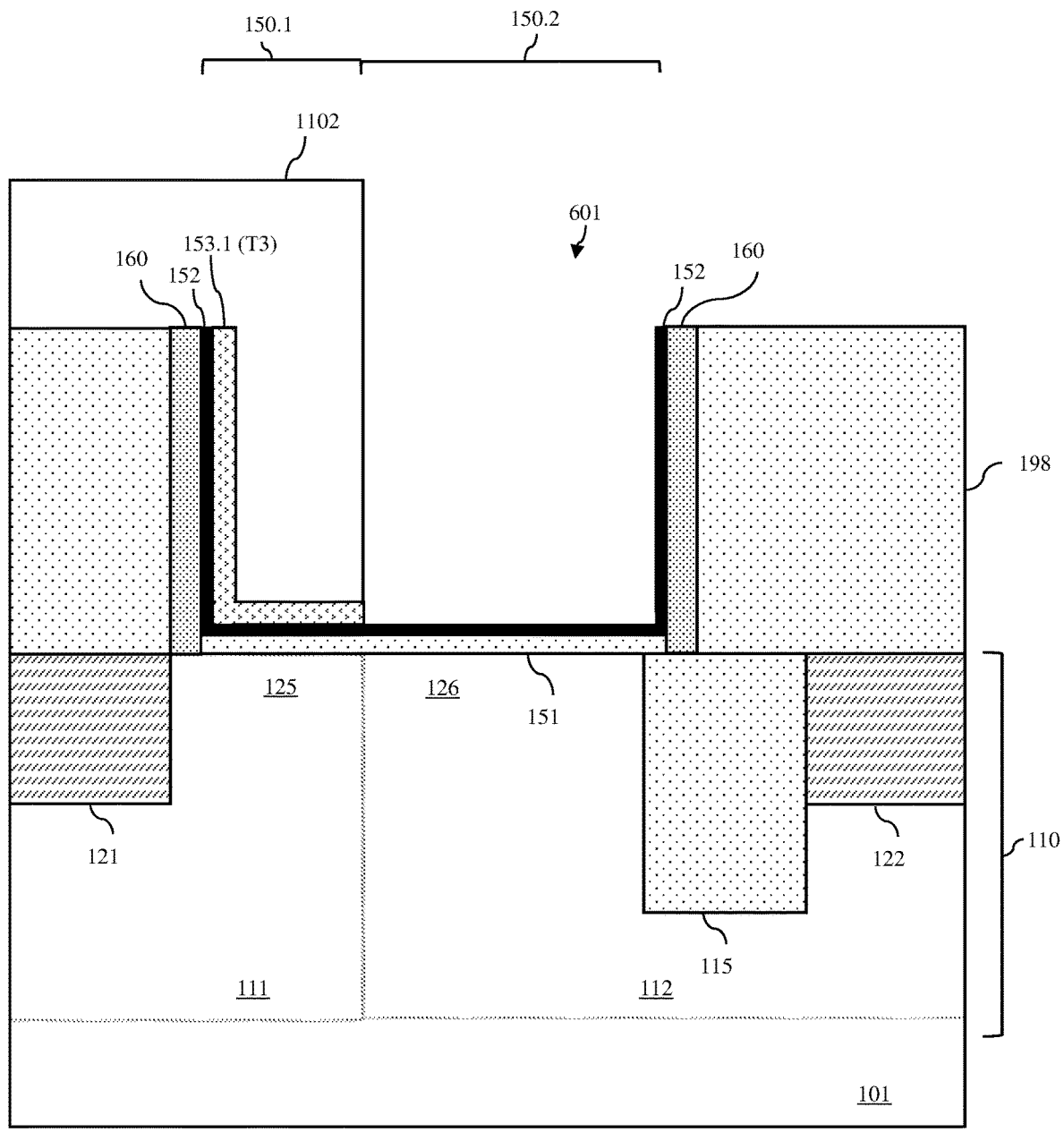
Figure 11E:
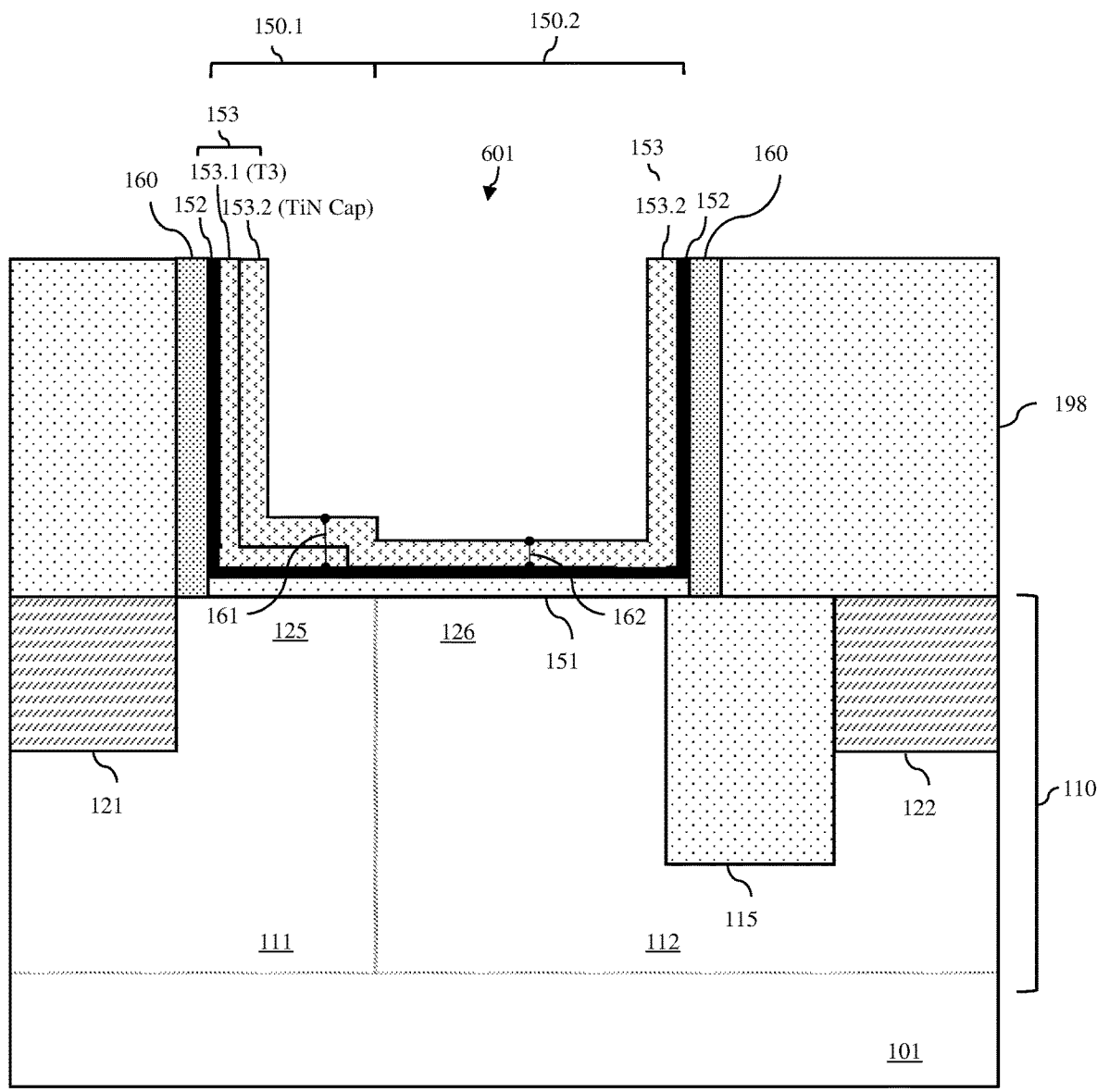

Process flow B can be integrated into this standard process flow. For example, a T2 layer can be conformally deposited into the gate openings for SLVT NFET(s), RVT NFET(s), RVT PFET(s). It can also be conformally deposited into the gate opening 601 for each LDMOS NFET(s), which will have both an RVT section (i.e., the first section 150.1) and a SLVT section (i.e., the second section 150.2) (see process step 1002 and FIG. 11A). The T2 layer can be patterned so that it is removed from the gate openings of the SLVT and RVT NFETs, leaving it in the gate openings of RVT PFETs. Patterning of the T2 layer can also include depositing and patterning a mask layer 1101 so that it is in the gate opening 601 on the portion of the T2 layer that is aligned with the drain drift region 126 and so that the portion of the T2 layer aligned with the channel region 125 is exposed. The mask layer 1101 can be, for example, a photoresist layer or a hardmask layer (e.g., a silicon nitride hard mask layer) and can be patterned using, for example, conventional lithographic patterning and etch techniques. Patterning of the T2 layer can also include performing a selective etch process to remove the exposed portion of the T2 layer from the gate opening 601, stopping on the gate dielectric layer 152 (see process steps 1004-1006 and FIG. 11B). The mask layer 1101 can then be removed and a T3 layer can be conformally deposited into the gate openings for SLVT NFET(s), RVT NFET(s), and RVT PFET(s). It can also be conformally deposited into the gate opening 601 for each LDMOS NFET(s) onto the portion of the gate dielectric layer aligned with the channel region 125 and over the remaining portion of the T2 layer aligned with the drain drift region 126 (see process step 1008 and FIG. 11C). The T3 layer can be patterned so that it is removed from the gate openings for the SLVT NFET(s), leaving it in the gate openings for the RVT NFET(s) and RVT PFET(s). Patterning of the T3 layer can also include depositing and patterning a mask layer 1102 so that it is in the gate opening 601 on the portion of the T3 layer that is aligned with the channel region 125 and so that the portion of the T3 layer aligned with the drain drift region 126 is exposed. The mask layer 1102 can be, for example, a photoresist layer or a hardmask layer (e.g., a silicon nitride hard mask layer) and can be patterned using, for example, conventional lithographic patterning and etch techniques. Patterning the T3 layer can also include performing a selective etch process to remove, from the gate opening 601, the exposed portion of the T3 layer and also the remaining portion of the T2 layer below to expose the portion of the gate dielectric layer 152 aligned with the drain drift region 126 (see process steps 1010-1012 and FIG. 11D). The mask layer 1102 can then be removed and a TiN cap layer can be conformally deposited (see process step 1014). The TiN cap layer can be deposited into the gate openings for the SLVT NFET(s), RVT NFET(s) and RVT PFET(s). The TiN cap layer can also be conformally deposited into the gate opening 601 for each LDMOS NFET on the remaining portion of the T3 layer in the first section 150.1 of the RMG structure aligned with the channel region 125 and further extending onto the exposed portion of the gate dielectric layer 152 in the second section 150.2 aligned with the drain drift region. Thus, each SLVT NFET will have a single layer of TiN (i.e., the TiN cap layer), each RVT NFET will have two layers of TiN (i.e., the T3 and TiN cap layers) and each LDMOS NFET will have a first section 150.1 with two layers 153.1-153.2 of TiN (i.e., the T3 and TiN cap layers) and a second section with only one layer 153.2 (i.e., the TiN cap layer).

Figure 12:
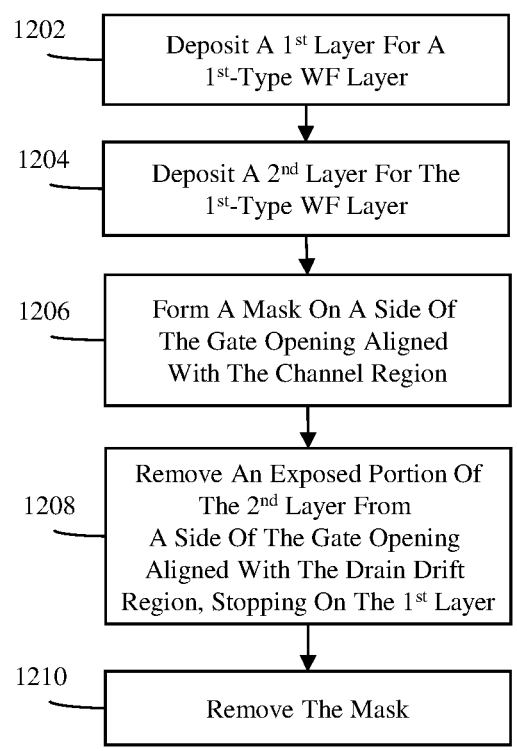
FIG. 12 is a flow diagram illustrating an exemplary process flow C for forming the first-type work function layer of the asymmetric RMG structure of the LDMOSFET of FIG. 1B.
Figure 13A:
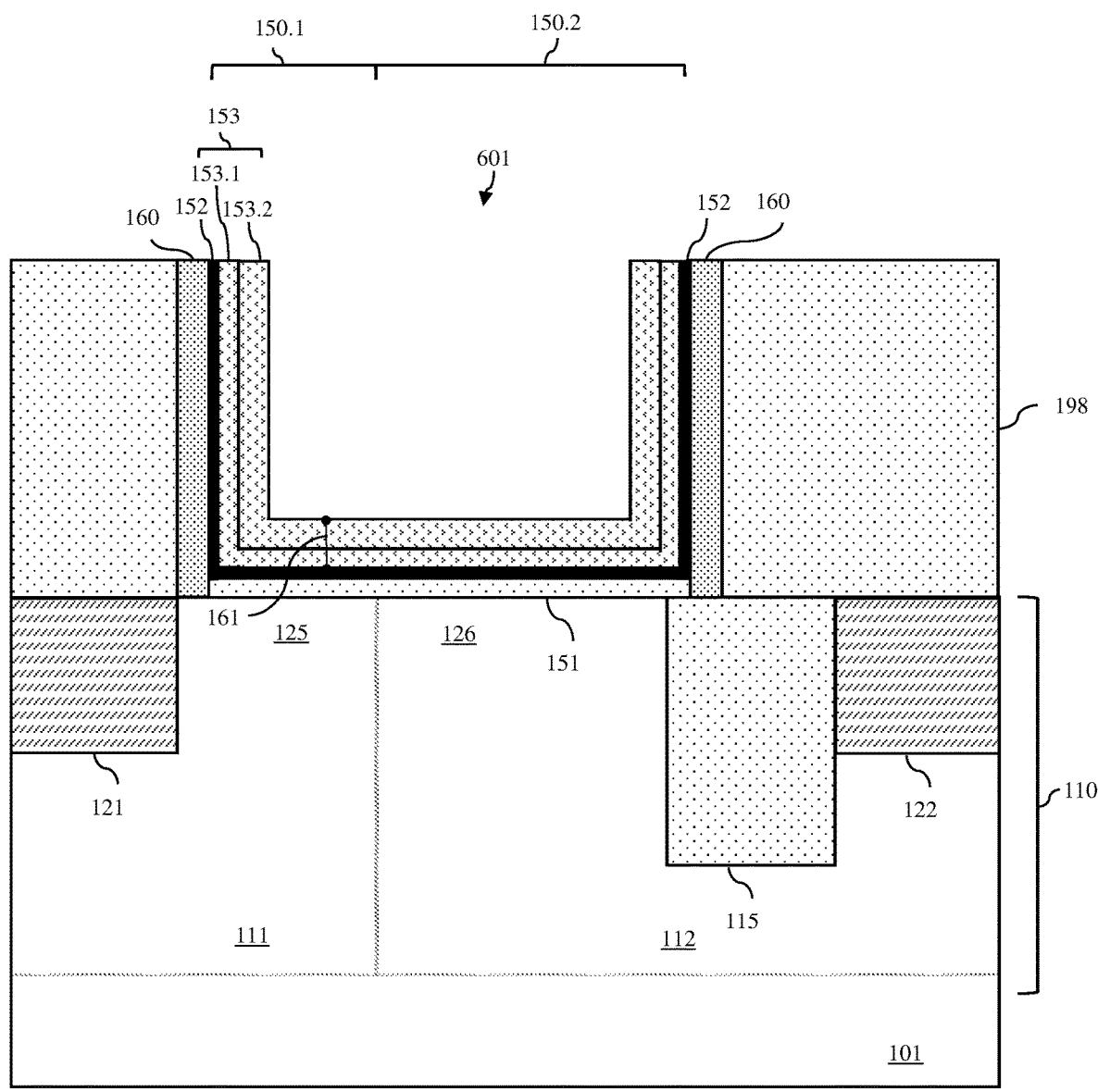
FIGS. 13A-13C are cross-section diagrams illustrating partially completed LDMOSFETs formed according to the flow diagram of FIG. 12.
Figure 13B:
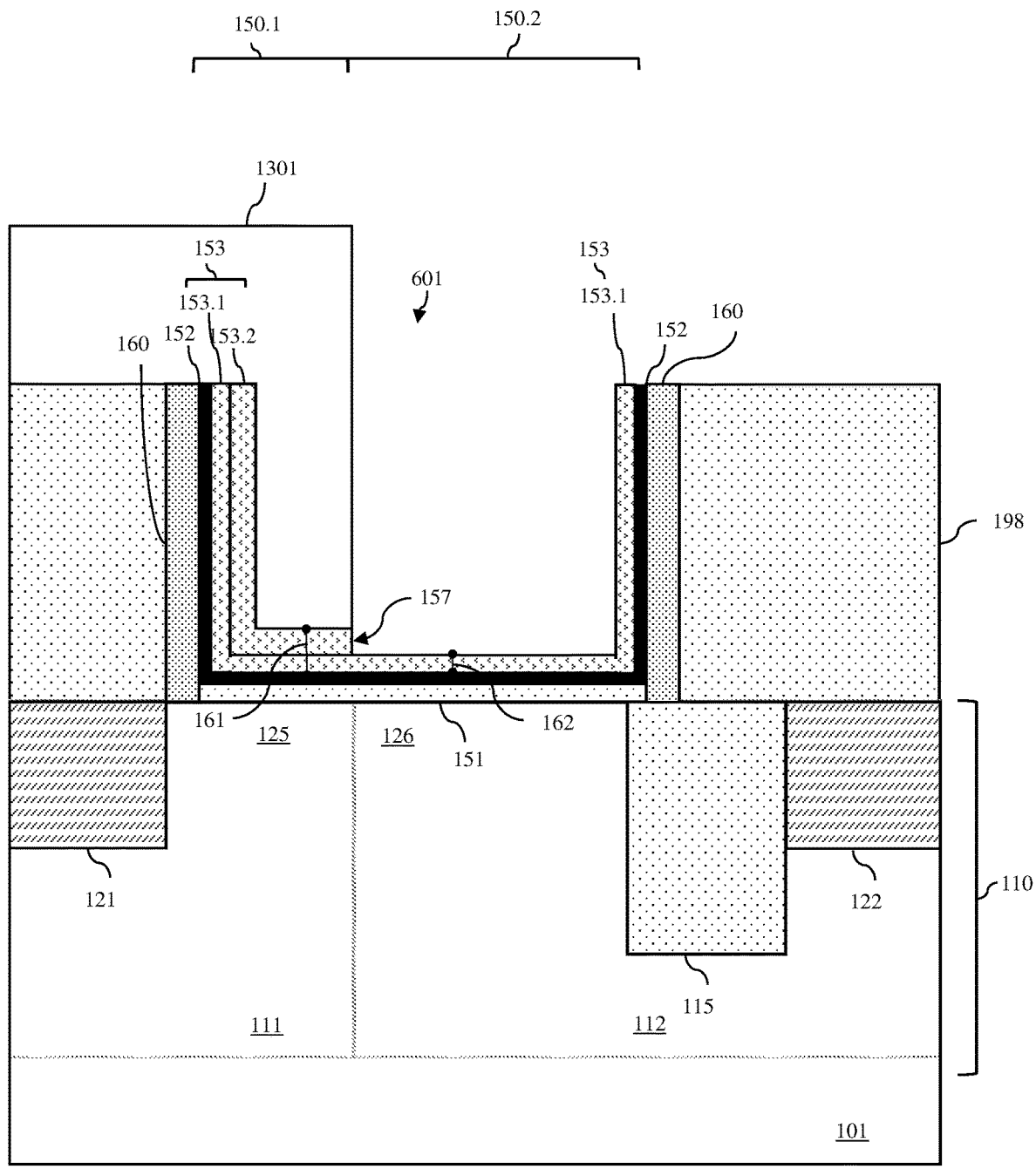
Figure 13C:
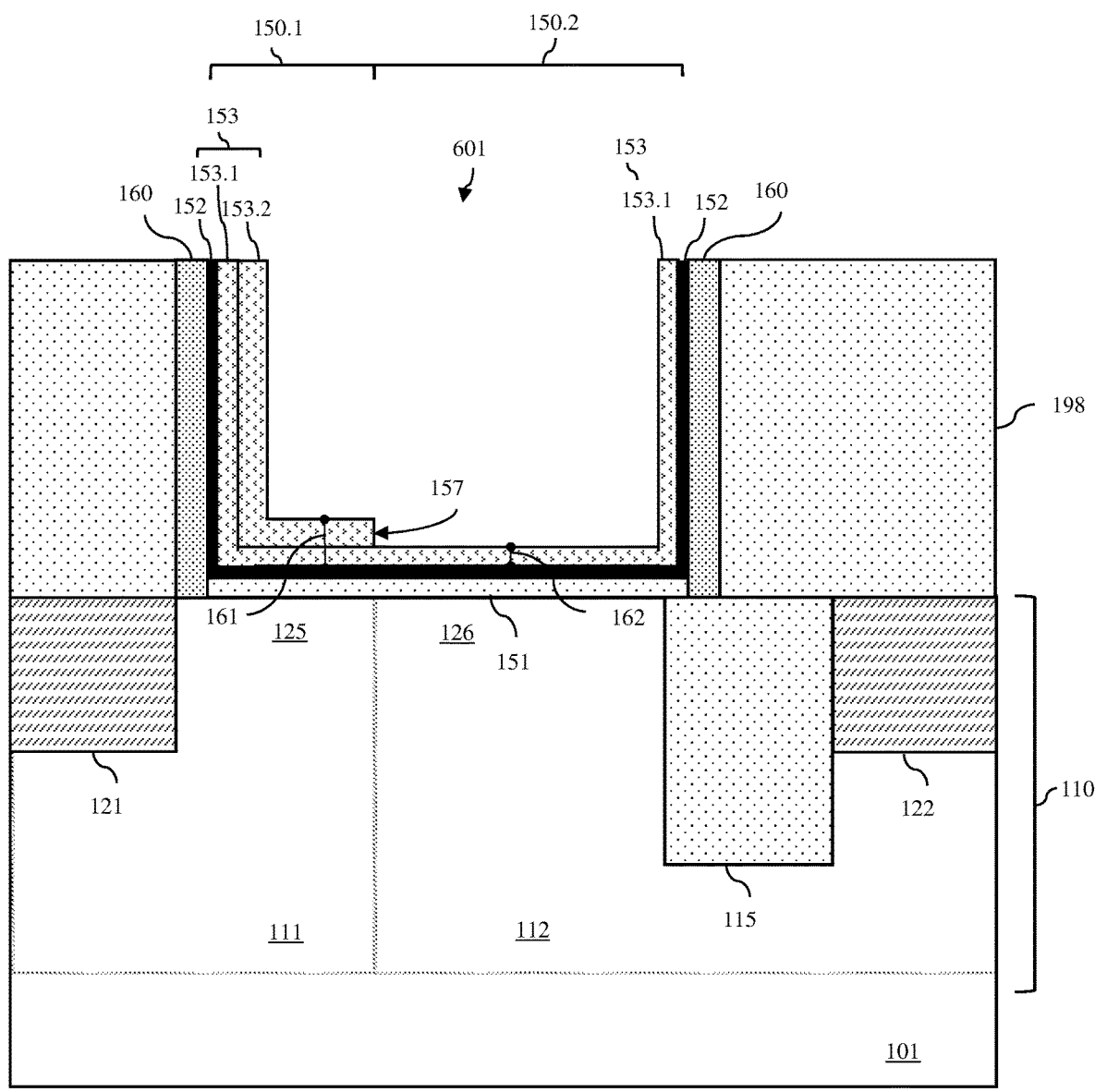

FIG. 12 is a flow diagram illustrating an exemplary process flow C for forming the multi-layer first-type work function layer shown in the asymmetric RMG structure 150B of the LDMOSFET 100B of FIG. 1B. In this process flow C, a first layer 153.1 with the first-type work function can be conformally deposited into the gate opening 601 so that it covers the gate dielectric layer 152 (see process step 1202 and FIG. 13A). A second layer 153.2 with the first-type work function can be conformally deposited into the gate opening 601 so that it covers the gate dielectric layer 152 (see process step 1204 and FIG. 13A). A mask layer 1301 can be deposited and patterned so that it is in the gate opening 601 on the portion of the second layer 153.2 aligned with the channel region 125 and so that the portion of the second layer 153.2 aligned with the drain drift region 126 is exposed (see process step 1206). The mask layer 1301 can be, for example, a photoresist layer or a hardmask layer (e.g., a silicon nitride hard mask layer) and can be patterned using, for example, conventional lithographic patterning and etch techniques. A selective etch process can then be performed to remove the exposed portion of the second layer 153.2 in the second section 150.2 (e.g., stopping on the first layer 153.1) (see process step 1208 and FIG. 13B). Thus, the remaining portion of the second layer 153.2 will have one end 157 that is approximately aligned with the junction 127 between the two wells 111 and 112. The mask layer 1301 can then be removed (see process step 1210 and FIG. 13C).

It should be noted that in the above-mentioned process flows where the first-type work function layer is formed so that it includes multiple layers 153.1-153.2, the multiple layers can be made of the same first-type work function metal or metal alloy or different first-type work function metal or metal alloys. For example, for an NFET, the multiple layers 153.1-153.2 can all be made of titanium nitride or any other suitable P-type metal or metal alloy material. Alternatively, the multiple layers 153.1-153.2 can be made of different P-type work function metal or metal alloy materials. For example, one layer (e.g., the layer that extends across both sections) can be made of titanium nitride and the other layer can be made of a different P-type metal or metal alloy material (e.g., titanium aluminum nitride, tantalum nitride, or any other suitable P-type work function metal or metal alloy material). It should be understood that process step 1208 of process flow C shown in FIG. 13B would be facilitated by the use of different materials for the multiple layers 153.1 and 153.2 because, if the multiple layers 153.1 and 153.2 are made of different materials, the specifications for the selective etch process could be customized to ensure that etching stops on the first layer 153.1. Otherwise, the etch process must be timed so as to stop at approximately the first layer and to prevent exposure of the gate dielectric layer 152 below.

Additionally, it should be understood that, while the process flows A-C only show the first-type work function layer as being formed using a total of two layers, the first-type work function layer could alternatively be formed using any suitable number of layers with the first-type work function as long as, in the resulting RMG structure, the second section has a lesser number of those layers than the first section in order to achieve the desired difference between the first thickness and the second thickness.

Figure 14:
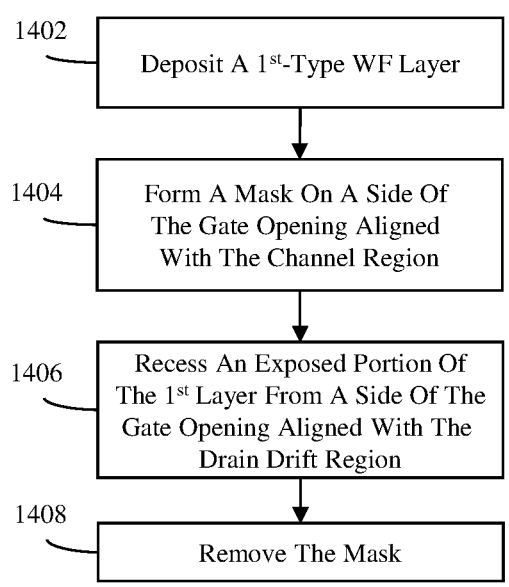
FIG. 14 is a flow diagram illustrating an exemplary process flow D for forming the first-type work function layer of the asymmetric RMG structure of the LDMOSFET of FIG. 1C.
Figure 15A:
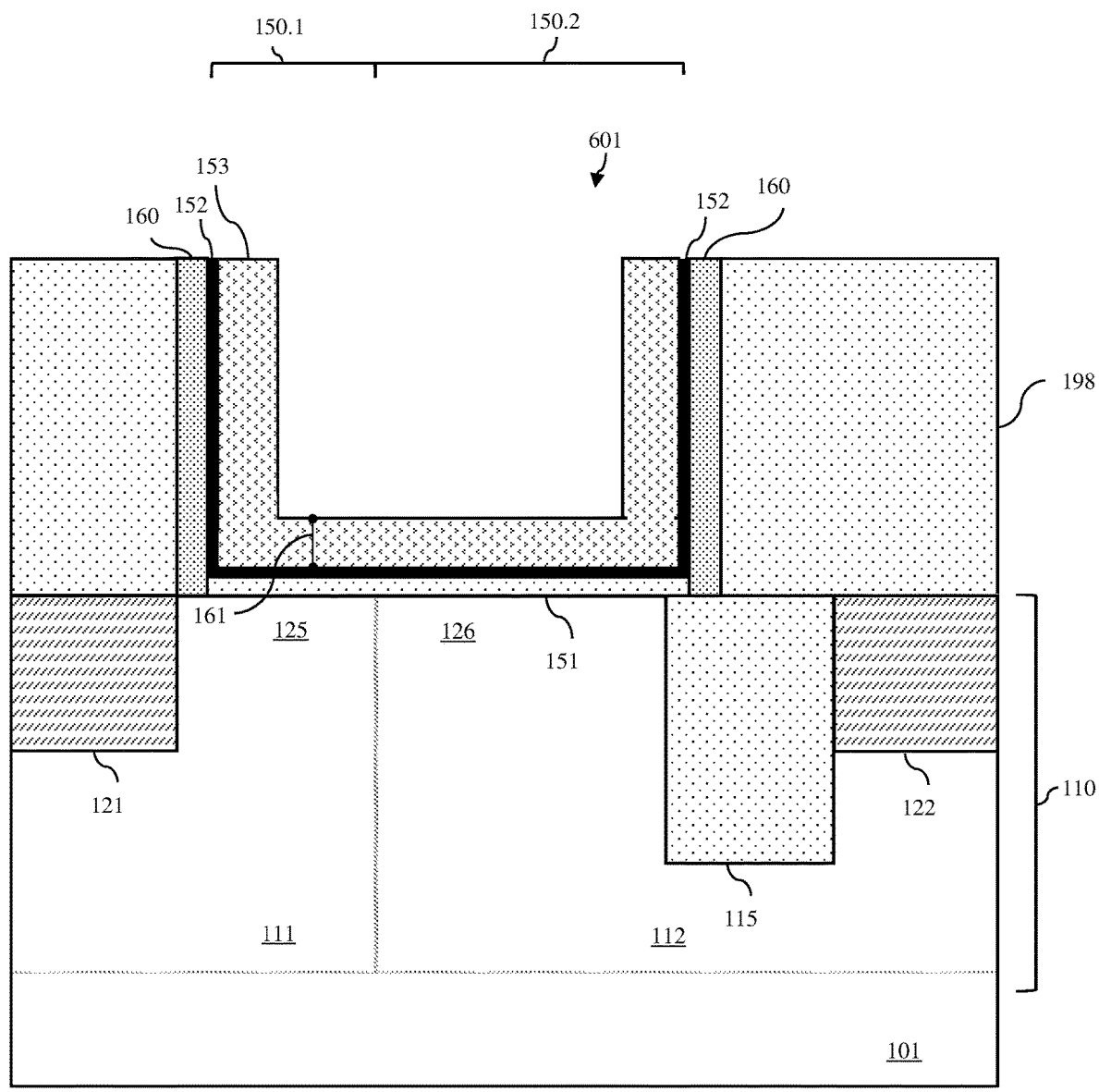
FIGS. 15A-15C are cross-section diagrams illustrating partially completed LDMOSFETs formed according to the flow diagram of FIG. 14.
Figure 15B:
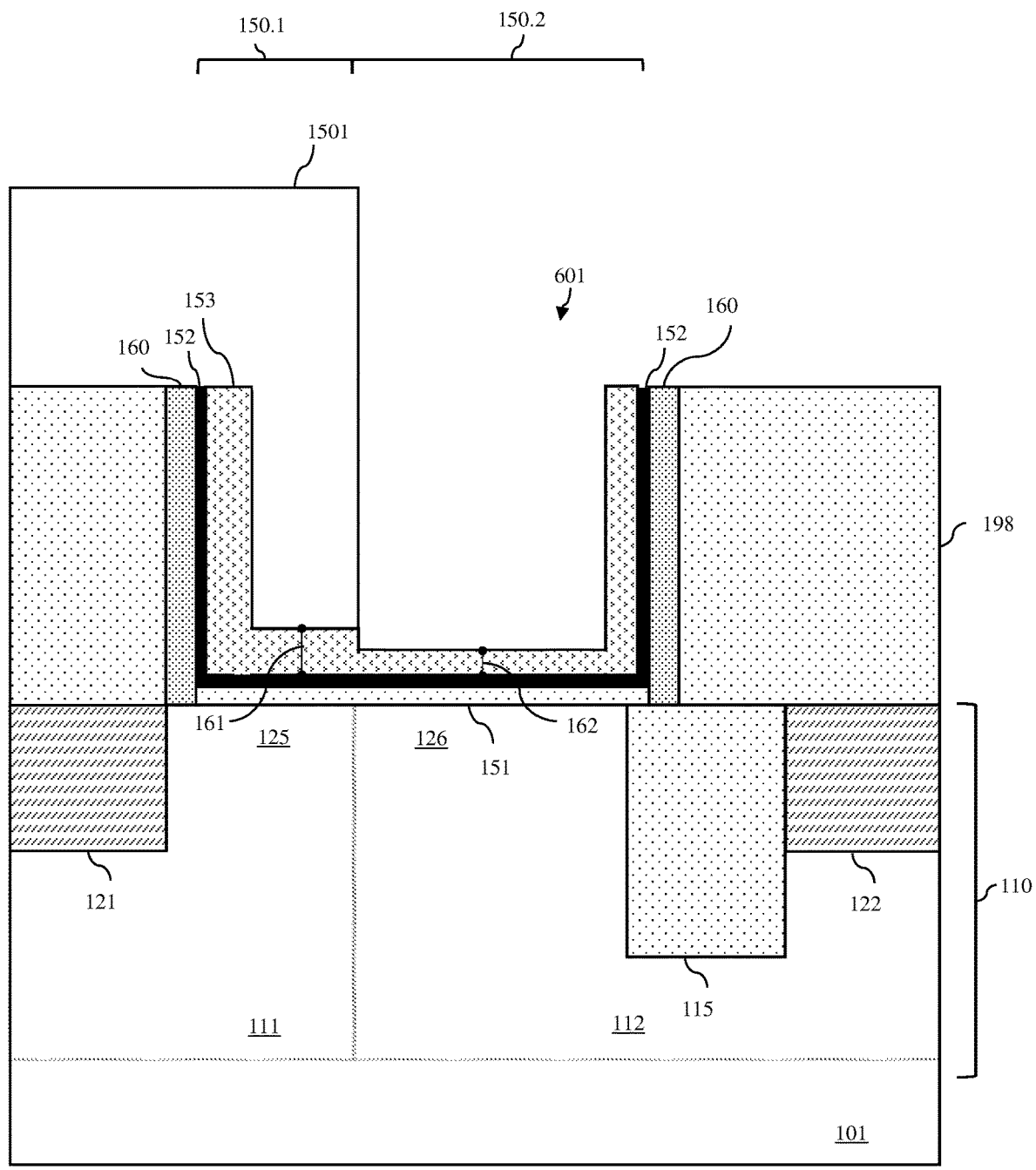
Figure 15C:
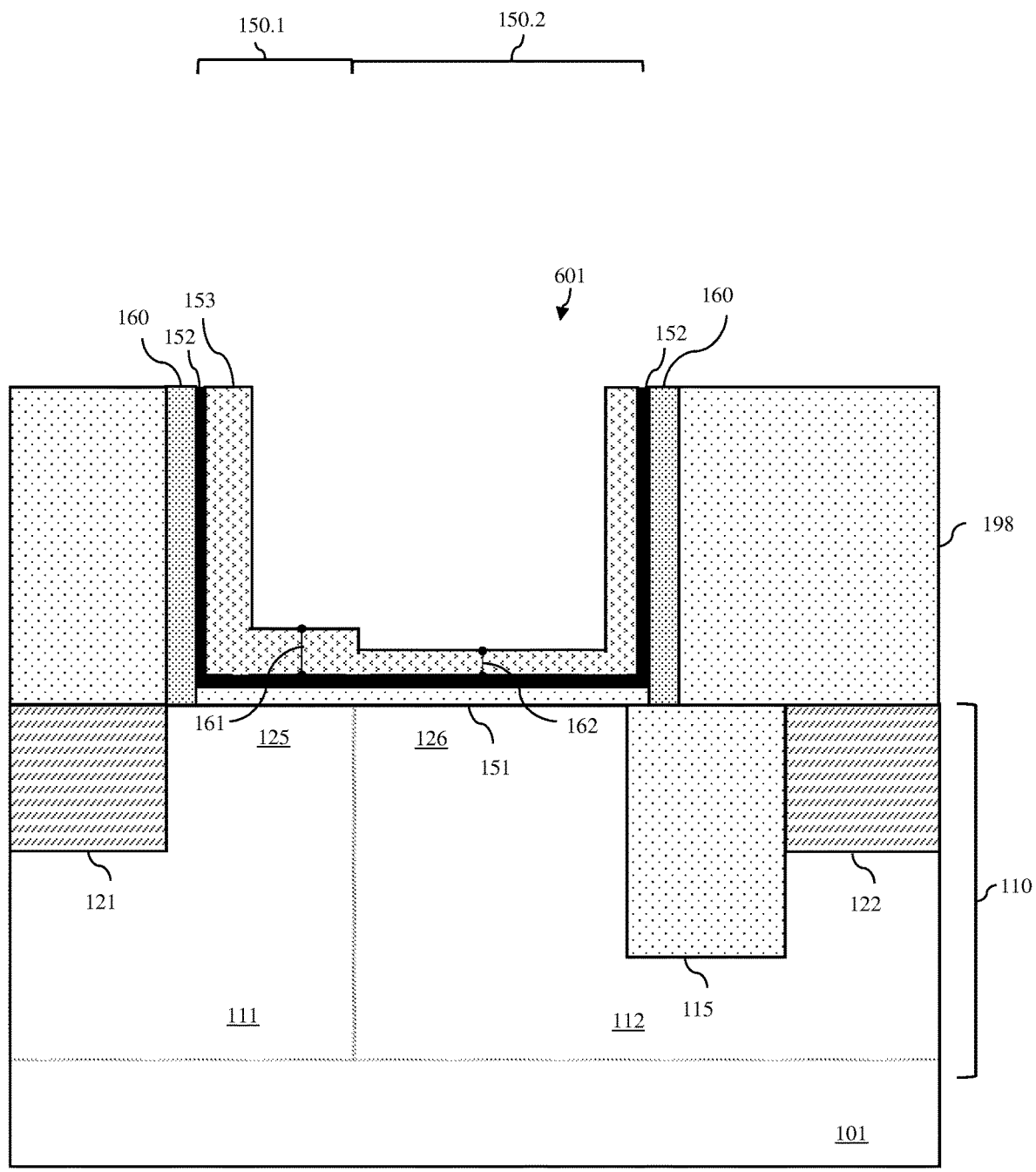

Finally, FIG. 14 is a flow diagram illustrating an exemplary process flow D for forming the first-type work function layer shown in the asymmetric RMG structure 150C of the LDMOSFET 100C of FIG. 1C. In this process flow D, a relatively thick first-type work function layer 153 can be conformally deposited into the gate opening 601 so that it covers the gate dielectric layer 152 (see process step 1402 and FIG. 15A). A mask layer 1501 can be deposited and patterned so that it is in the gate opening 601 on the portion of layer 153 aligned with the channel region 125 and so that the portion of the layer 153 aligned with the drain drift region 126 is exposed (see process step 1404). The mask layer 1501 can be, for example, a photoresist layer or a hardmask layer (e.g., a silicon nitride hard mask layer) and can be patterned using, for example, conventional lithographic patterning and etch techniques. A selective etch process can then be performed to etch back (i.e., recess) the exposed portion of the layer 153 in the second section 150.2 (see process step 1406 and FIG. 15B). Process step 1406 can be timed to prevent exposure of the gate dielectric layer 152 below. The mask layer 1501 can then be removed (see process step 1408 and FIG. 15C).

As mentioned above, formation of the asymmetric RMG structure (e.g., 150A, 150B or 150C) at process 408 can further include forming (e.g., conformally depositing) a second-type work function layer 154 in the gate opening 601 on the first-type work function layer 153 (see FIGS. 1A-1C). Again, as mentioned above, for an NFET, this second-type work function is an N-type work function. In some embodiments, this N-type work function layer can be aluminum or some other metal or metal alloy with the P-type work function.

Formation of this asymmetric RMG structure (e.g., 150A, 150B or 150C) at process 408 can also include depositing a conductive fill material 156 on the second-type work function layer 154 in the first section 150.1 and the second section 150.2 so as to fill any remaining space within the gate opening 601 (see FIGS. 1A-1C). This conductive fill material 156 can include any suitable fill metal or fill metal alloy, such as tungsten, a tungsten alloy (e.g., tungsten silicide or titanium tungsten), cobalt, aluminum or any other suitable fill metal or fill metal alloy.

To avoid clutter in the Figures and to allow the reader to focus on the salient aspects of the disclosed method, the various gate materials that are deposited to form the asymmetric RMG structure are only shown as having been deposited within the gate opening. However, one skilled in the art would recognize that these gate materials would also be deposited onto the top surface of the dielectric layer 198. Thus, following deposition of the conductive fill material 156, a polishing process (e.g., a CMP) process can be performed in order to remove any gate materials from the top surface of the dielectric layer 198.

Additional processing can further be performed in order to complete the LDMOSFET structures. The additional processing can include, but is not limited to, formation of a dielectric gate cap on the top of the asymmetric RMG structure, formation of metal plugs with dielectric plug caps on the tops of the source and drain regions, deposition of interlayer dielectric material, and contact formation.

It should be understood that in the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor comprising:
   a first-type well in a semiconductor body and having a first-type conductivity;
   a second-type well in the semiconductor body positioned laterally adjacent to the first-type well and having a second-type conductivity different from the first-type conductivity; and
   a gate structure on the semiconductor body at a junction between the first-type well and the second-type well,
   wherein the gate structure has a first section traversing the semiconductor body adjacent to the first-type well and a second section traversing the semiconductor body adjacent to the second-type well,
   wherein the gate structure comprises a first-type work function layer having a first portion with a first thickness in the first section and further having a second portion with a second thickness that is less than the first thickness in the second section,
   wherein the gate structure further comprises a second-type work function layer on the first-type work function layer in the first section and in the second section, and
   wherein the first-type work function layer has a first-type work function within a first range and the second-type work function layer has a second-type work function within a second range that is different from the first range.

2. The transistor of claim 1, wherein the first-type work function layer comprises multiple layers and wherein the first portion has a greater number of the multiple layers than the second portion.

3. The transistor of claim 1, wherein the first-type work function layer comprises a single layer.

4. The transistor of claim 1, wherein the semiconductor body comprises a semiconductor fin and wherein the gate structure is adjacent to a top surface and opposing sides of the semiconductor fin.

5. The transistor of claim 1, further comprising:
a channel region in the first-type well, wherein the first section of the gate structure is adjacent to the channel region;
a drain drift region in the second-type well and positioned laterally immediately adjacent to the channel region at the junction between the first-type well and the second-type well and wherein the second section of the gate structure is adjacent to the drain drift region;
a source region immediately adjacent to the first-type well such that the channel region is positioned laterally between the source region and the drain drift region; and
a drain region immediately adjacent to the second-type well such that the drain drift region is positioned laterally between the channel region and the drain region,
wherein the source region and the drain region comprise second-type source and drain regions with a higher conductivity level than the second-type well.

6. The transistor of claim 5, further comprising a trench isolation region in the second-type well positioned laterally between the drain drift region and the drain region.

7. An N-type transistor comprising:
a Pwell in a semiconductor body;
an Nwell in the semiconductor body positioned laterally adjacent to the Pwell; and
a gate structure on the semiconductor body at a junction between the Pwell and the Nwell,
wherein the gate structure has a first section traversing the semiconductor body adjacent to the Pwell and a second section traversing the semiconductor body adjacent to the Nwell,
wherein the gate structure comprises a P-type work function layer having a first portion with a first thickness in the first section and further having a second portion with a second thickness that is less than the first thickness in the second section, and
wherein the gate structure further comprises an N-type work function layer on the P-type work function metal layer in the first section and in the second section.

8. The N-type transistor of claim 7, wherein the P-type work function layer comprises a single layer.

9. The N-type transistor of claim 7, wherein the semiconductor body comprises a semiconductor fin and wherein the gate structure is adjacent to a top surface and opposing sides of the semiconductor fin.

10. The N-type transistor of claim 7, further comprising:
a channel region in the Pwell, wherein the first section of the gate structure is adjacent to the channel region;
a drain drift region in the Nwell and positioned laterally immediately adjacent to the channel region at the junction between the Pwell and the Nwell and wherein the second section of the gate structure is adjacent to the drain drift region;
a source region immediately adjacent to the Pwell such that the channel region is positioned laterally between the source region and the drain drift region; and
a drain region immediately adjacent to the Nwell such that the drain drift region is positioned laterally between the channel region and the drain region,
wherein the source region and the drain region comprise N-type source and drain regions at a higher conductivity level than the Nwell.

11. The N-type transistor of claim 10, further comprising a trench isolation region in the Nwell positioned laterally between the drain drift region and the drain region.

12. The N-type transistor of claim 7, wherein the P-type work function layer comprises multiple layers and wherein the first portion has a greater number of the multiple layers than the second portion.

13. The N-type transistor of claim 12, wherein the multiple layers comprise titanium nitride.

14. The N-type transistor of claim 12, wherein one of the multiple layers that is in both the first section and the second section comprises titanium nitride.

\* \* \* \* \*